United States Patent
Chittipeddi et al.

(10) Patent No.: US 6,773,994 B2
(45) Date of Patent: Aug. 10, 2004

(54) CMOS VERTICAL REPLACEMENT GATE (VRG) TRANSISTORS

(75) Inventors: Sailesh Chittipeddi, Allentown, PA (US); Michael James Kelly, Orefield, PA (US)

(73) Assignee: Agere Systems Inc., Allentown, PA (US)

( * ) Notice: Subject to any disclaimer, the term of this patent is extended or adjusted under 35 U.S.C. 154(b) by 41 days.

(21) Appl. No.: 10/036,020

(22) Filed: Dec. 26, 2001

(65) Prior Publication Data

US 2003/0119237 A1 Jun. 26, 2003

(51) Int. Cl.[7] ............................................. H01L 21/336
(52) U.S. Cl. ...................... 438/268; 438/269; 438/270; 438/199; 438/275; 257/369; 257/331; 257/787
(58) Field of Search ................................. 438/268, 269, 438/270, 199, 275; 257/787, 331, 369

(56) References Cited

U.S. PATENT DOCUMENTS

| | | | |
|---|---|---|---|
| 4,366,495 A | | 12/1982 | Goodman et al. |
| 4,455,565 A | | 6/1984 | Goodman et al. |
| 4,587,713 A | | 5/1986 | Goodman et al. |
| 4,670,768 A | * | 6/1987 | Sunami et al. ............. 257/331 |
| 4,683,643 A | | 8/1987 | Nakajima et al. |
| 4,786,953 A | | 11/1988 | Morie et al. |
| 4,837,606 A | | 6/1989 | Goodman et al. |
| 5,010,386 A | * | 4/1991 | Groover, III ............... 257/369 |
| 5,140,368 A | * | 8/1992 | Szlucha ..................... 399/130 |
| 5,140,388 A | * | 8/1992 | Bartelink .................. 257/369 |
| 5,208,172 A | | 5/1993 | Fitch et al. |
| 5,342,797 A | | 8/1994 | Sapp et al. |
| 5,414,289 A | | 5/1995 | Fitch et al. |
| 5,502,009 A | * | 3/1996 | Lin ............................ 438/275 |
| 5,554,870 A | | 9/1996 | Fitch et al. |
| 5,576,238 A | | 11/1996 | Fu |
| 5,668,391 A | | 9/1997 | Kim et al. |
| 5,744,846 A | | 4/1998 | Batra et al. |

(List continued on next page.)

OTHER PUBLICATIONS

Dudek, et al, "Lithography–Independent Nanometer Silicon MOSFET's on Insulator", IEEE Transactions on Electron Devices, vol. 43, No. 10, Oct. 1996, pp. 1626–1631.

(List continued on next page.)

*Primary Examiner*—Matthew Smith
*Assistant Examiner*—B. V. Keshavan

(57) ABSTRACT

An architecture and process for forming CMOS vertical replacement gate metal oxide semiconductor field-effect transistors is disclosed. The integrated circuit structure includes a semiconductor area with a major surface formed along a plane and first and second source/drain dopes regions formed in the surface. An insulating trench is formed between the first and second source/drain regions. A third doped region forming a channel of a different conductivity type than the first source/drain region is positioned over the first source/drain region. A fourth doped region is formed over the second source/drain region, having an opposite conductivity type with respect to the second source/drain region, and forming a channel region. Fifth and sixth source/drain regions are formed respectively over the third and fourth doped regions. In an associated method of manufacturing the semiconductor device, first and second source/drain regions are formed in the semiconductor layer, followed by the formation of third and fourth doped regions forming the channel. Fifth and sixth doped regions are then formed over the channels to complete the structure. An insulating region is formed between the first and the second source/drain regions to isolate these regions of opposite conductivity type.

14 Claims, 19 Drawing Sheets

U.S. PATENT DOCUMENTS

| | | | |
|---|---|---|---|
| 5,861,347 A | * 1/1999 | Maiti et al. | 438/787 |
| 6,027,975 A | 2/2000 | Hergenrother et al. | |
| 6,072,216 A | 6/2000 | Williams et al. | |
| 6,133,099 A | 10/2000 | Sawada | |
| 6,197,641 B1 | 3/2001 | Hergenrother et al. | |
| 6,297,531 B2 | 10/2001 | Armacost et al. | |
| 6,300,199 B1 | * 10/2001 | Reinberg | 438/268 |
| 6,309,930 B1 | * 10/2001 | Goebel et al. | 438/270 |
| 6,372,559 B1 | * 4/2002 | Crowder et al. | 438/157 |
| 6,387,758 B1 | * 5/2002 | Yu et al. | 438/269 |
| 6,518,622 B1 | * 2/2003 | Chew et al. | 257/329 |
| 2003/0052365 A1 | * 3/2003 | Chaudhry et al. | 257/328 |
| 2003/0060015 A1 | * 3/2003 | Layman et al. | 438/275 |

OTHER PUBLICATIONS

Risch, et al, "Vertical MOS Transistors with 70 nm Channel Length", IEEE Transactions on Electron Devices, vol. 43, No. 9, Sep. 1996, pp. 1495–1498.

Takato, et al, "Impact of Surrounding Gate Transistor (SGT) for Ultra–High–Density LSI's", IEEE Transactions on Electron Devices, vol. 38, No. 3, Mar. 1991, pp. 573–577.

Takato, et al, "High Performance CMOS Surrounding Gate Transistor (SGT) for Ultra High Density LSIs", IEDM 1988, pp. 222–225.

Hergenrother, et al, "The Vertical Replacement–Gate (VRG) MOSFET: A 50–nm Vertical MOSFET with Lithography–Independent Gate Length", Technical Digest of IEDM, 1999, pp. 75–78.

Oh, et al, "50 nm Vertical Replacement–Gate (VRG) pMOS-FETs", IEEE 2000.

Hergenrother, et al, "The Vertical Replacement–Gate (VRG) MOSFET: A High–Performance Vertical MOSFET with Lithography–Independent Critical Dimensions", no publication information apparent from document.

Monroe, et al, "The Vertical, Replacement–Gate (VRG) Process for Scalable, General–purpose Complementary Logic", Paper 7.5, pp. 1–7, date and publication information unknown.

* cited by examiner

CMOS VERTICAL REPLACEMENT GATE (VRG) TRANSISTORS

FIELD OF THE INVENTION

The present invention is directed to semiconductor devices incorporating junctions of varying conductivity types designed to conduct current and methods of making such devices. More specifically, the present invention is directed to integrated circuitry comprising complementary metal-oxide field-effect transistors (CMOS) vertical replacement-gate (VRG) field-effect transistor devices and methods for fabricating integrated circuits incorporating such devices.

BACKGROUND OF THE INVENTION

Enhancing semiconductor device performance and increasing device density (the number of devices per unit area), continue to be important objectives of the semiconductor industry. Device density is increased by making individual devices smaller and packing devices more compactly. But, as the device dimensions (also referred to as the feature size or design rules) decrease, the methods for forming devices and their constituent elements must be adapted. For instance, production device sizes are currently in the range of 0.25 microns to 0.18 microns, with an inexorable trend toward smaller dimensions. However, as the device dimensions shrink, certain manufacturing limitations arise, especially with respect to the attendant lithographic processes. In fact, current lithographic processes are nearing the point where they are unable to accurately manufacture devices at the required minimal sizes demanded by today's device users.

Currently most metal-oxide-semiconductor field effect transistors (MOSFETs) are formed in a lateral configuration, with the current flowing parallel to the plane of the substrate or body surface. As the size of these MOSFET devices decreases to achieve increased device density, the fabrication process becomes increasingly difficult. In particular, the lithographic process for creating the gate channel is problematic, as the wavelength of the radiation used to delineate an image in the lithographic pattern approaches the device dimensions. Therefore, for such lateral MOSFETs, the gate length is approaching the point where it cannot be precisely controlled through the lithographic techniques.

Recent advances in packing density have resulted in several variations of a vertical MOSFET. In particular, the vertical device described in Takato, H., et al., "Impact of Surrounding Gates Transistor (SGT) for Ultra-High-Density LSI's, IEEE Transactions on Electron Devices, Volume 38(3), pp. 573–577 (1991), has been proposed as an alternative to the planar or lateral MOSFET device. Recently, there has been described a MOSFET characterized as a vertical replacement gate transistor. See Hergenrother, et al, "The Vertical-Replacement Gate (VRG) MOSFET" A50-nm Vertical MOSFET with Lithography-Independent Gate Length," Technical Digest of the International Electron Devices Meeting, p. 75, 1999.

A plurality of planar MOSFET active devices fabricated on an integrated circuit chip are shown in the FIG. 1 cross-sectional view. A substrate 9 comprises a p+ portion 50 and a p− layer 52, the latter typically grown by an epitaxial technique. MOSFETs 2, 4 and 6 are fabricated on the substrate 9. The MOSFET 2 is separated from the MOSFET 4 by a LOCOS (local oxidation of silicon) region 10. Similarly, the MOSFET 6 is separated from the MOSFET 4 by a LOCOS region 12. Alternatively, the MOSFETS 2, 4 and 6 may be electrically separated by shallow trench isolation (STI) techniques. The MOSFET 2 includes a gate 14, a source region 16 and a drain region 18 diffused in an n-type well 20. The MOSFET 4 includes a gate 28, a source region 30 and a drain region 32 diffused into a p-type well 34. Finally, the MOSFET 6 includes a gate 38, a source region 40 and a drain region 42, diffused in an n-type well 44. The gates 14, 28 and 38 are separated from the substrate 9 by a silicon dioxide layer 46, also referred to as the gate oxide layer. As FIG. 1 (and the other Figures in the present application) is intended to be a simplified representation of a portion of an integrated circuit, the various contacts, interconnects, vias and metal layers are not shown and the features are not drawn to scale.

It is particularly advantageous, especially in digital applications, to fabricate a combination of an n-channel and a p-channel MOSFETs on adjacent regions of a chip. This complementary MOSFET (CMOS) configuration is illustrated in the form of a basic inverter circuit in FIG. 2. The drains of the MOSFETs (for instance the MOSFETs 2 and 4 in FIG. 1) are connected together and form the output. The input terminal is the common connection of the MOSFET gates (for example the gates 14 and 28 of FIG. 1). In the FIG. 2 schematic, the MOSFET 2 is the PMOS device and the MOSFET 4 is the NMOS device illustrated in the FIG. 1 cross-section.

BRIEF SUMMARY OF THE INVENTION

To provide further advances in the use of CMOS semiconductor devices, an architecture is provided for creating vertical replacement gate (VRG) CMOS devices, which offer the advantages of both the ubiquitous CMOS device along with the desirable space-saving and fabrication advancements associated with the VRG device.

According to one embodiment of the invention, a semiconductor device includes a first layer of semiconductor material having first and second spaced-apart and isolated doped regions formed therein, wherein the first and the second doped regions are of opposite conductivity type. A third doped region of a different conductivity type than the first doped region is formed over the first doped region. A fourth doped region is formed over the second doped region with a different conductivity type than the second doped region. First and second oxide layers are formed proximate to the third and fourth doped regions, respectively.

The first doped region is a source/drain region of a first field-effect transistor, and the third doped region is the channel. The source/drain region of a second field-effect transistor comprises the second doped region and the fourth doped region forms the channel thereof. A second source/drain region for each MOSFET is formed over each of the channels.

In an associated method of manufacture, an integrated circuit structure is fabricated by providing a semiconductor layer suitable for device formation and having a surface formed along a first plane. For a first field-effect transistor a first device region is formed in the semiconductor layer, wherein the device region is selected from among a source and a drain region. For a second field-effect transistor a second device region is formed in the semiconductor layer, wherein the second device region is selected from among a source and a drain region and is further isolated from the first device region. Channel regions for each of the first and the second field-effect transistors are formed above the first and the second device regions, respectively, within trenches formed in a plurality of regions over the first and the second device regions. At least two of the plurality of layers comprise doped insulating layers from which source/drain extension regions are formed. A first doped insulating layer of a first conductivity type is formed over the first device region followed by the formation of a doped insulating layer over the entire structure and of the second conductivity type. The second doped insulating layer is then removed in the area overlying the first device region such that the resulting structure comprises the first doped insulating layer over the first device region and the second doped insulting layer over the second device region. Similar processing steps are used to form third and fourth doped insulating layers over the first and the second doped insulating layers, respectively. Disposed between the first/second and the third/fourth doped insulating regions is a sacrificial layer that is later removed to allow the formation of gate oxide material in exposed portions of the channel regions.

BRIEF DESCRIPTION OF THE DRAWINGS

The present invention can be more easily understood and the further advantages and uses thereof more readily apparent, when considered in view of the description of the preferred embodiments and the following figures in which.

In accordance with common practice, the various described device features are not drawn to scale, but are drawn to emphasize specific features relevant to the invention. Reference characters denote like elements throughout the figures and text.

DESCRIPTION OF THE INVENTION

The described embodiments include CMOS structures and associated fabrication techniques. A process for fabricating CMOS vertical MOSFETs is described in commonly-owned Patent Application U.S. Ser. No. 290,533, entitled, "A CMOS Integrated Circuit Having Vertical Transistors and a Process for Fabricating Same," filed on Jan. 18, 1999, and incorporated herein by reference. A more general description of the structure and fabrication of vertical transistor MOSFETs (of either the NMOS or PMOS type) is set forth in commonly assigned U.S. Pat. Nos. 6,027,975 and 6,197,641, also incorporated herein by reference.

With regard to the fabrication of transistors and integrated circuits, the term "major surface" refers to that surface of the semiconductor layer in and about which a plurality of transistors are fabricated, e.g., in a planar process. As used herein, the term "vertical" means substantially orthogonal with respect to the major surface. Typically, the major surface is along a <100> plane of a monocrystalline silicon layer on which the field-effect transistor devices are fabricated. The term "vertical transistor" means a transistor with individual semiconductor components vertically oriented with respect to the major surface so that the current flows vertically from source to drain. By way of example, for a vertical MOSFET, the source, channel and drain regions are formed in relatively vertical alignment with respect to the major surface.

FIGS. 3 through 34 illustrate cross-sectional views of an integrated circuit structure 10 during various stages of fabrication to configure an exemplary circuit function according to one embodiment of the present invention. From the description, it will become apparent how a plurality of vertical CMOS transistors may be configured alone or in combination with other devices, e.g., bipolar junction transistors, planar MOSFETs, capacitors or resistors, to form an integrated circuit. The various semiconductor features and regions described herein are preferably composed of silicon but it is known to those skilled in the art that other embodiments of the invention may be based on other semiconductor materials, including compound or heterojunction semiconductors alone or in combination.

Figure 3:
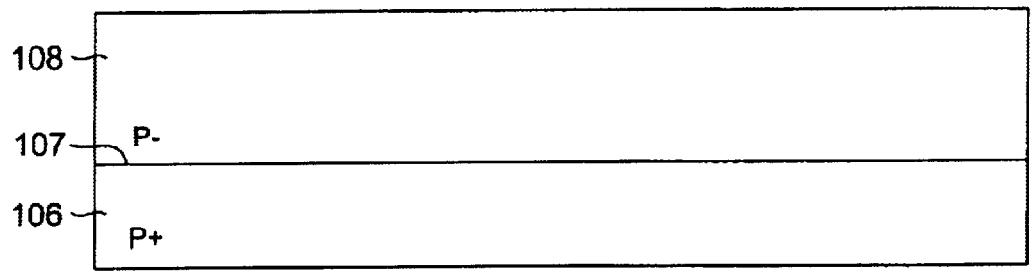
FIGS. 3 through 34 illustrate, in cross-section, a circuit structure according to a first embodiment of the invention during sequential fabrication steps.

Referring to FIG. 3, there is shown a monocrystalline semiconductor layer 106 having an exposed major surface 107 formed along a crystal plane over an upper portion of the layer 106. An epitaxial layer 108 is grown by conventional means over the exposed major surface 106. In one embodiment, the substrate 106 is heavily doped with a p-type material (referred to as p+ doping) and the epitaxial layer 108 is lightly p-type doped (referred to as p− doping). The thickness of the substrate 106 and the epitaxial layer 108, the concentration of the dopant therein, and the type of dopant (e.g., n-type or p-type) are all matters of design choice.

Figure 4:
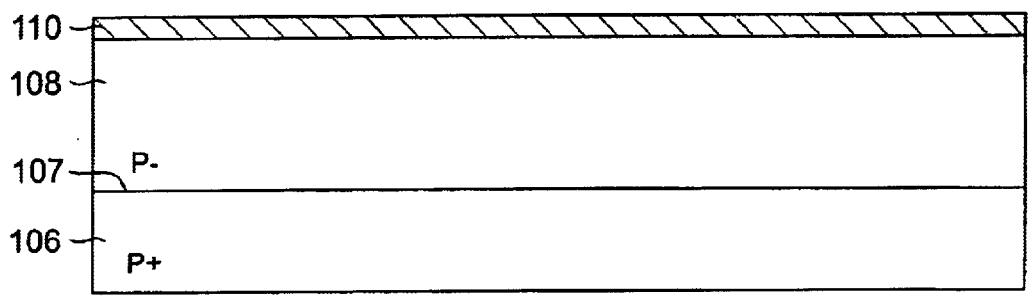
Figure 5:
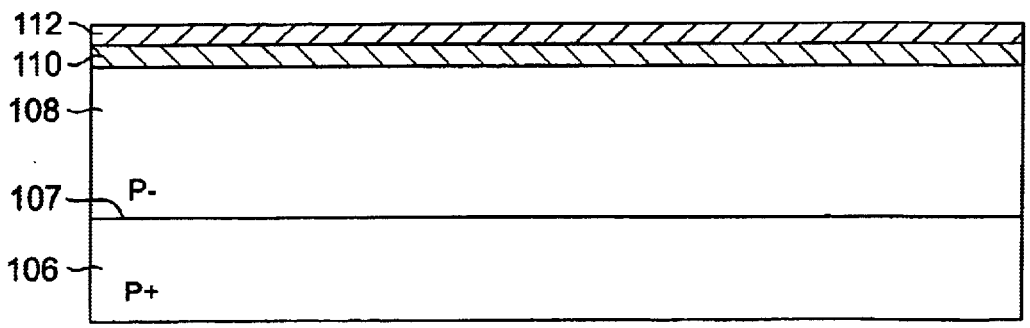
Figure 6:
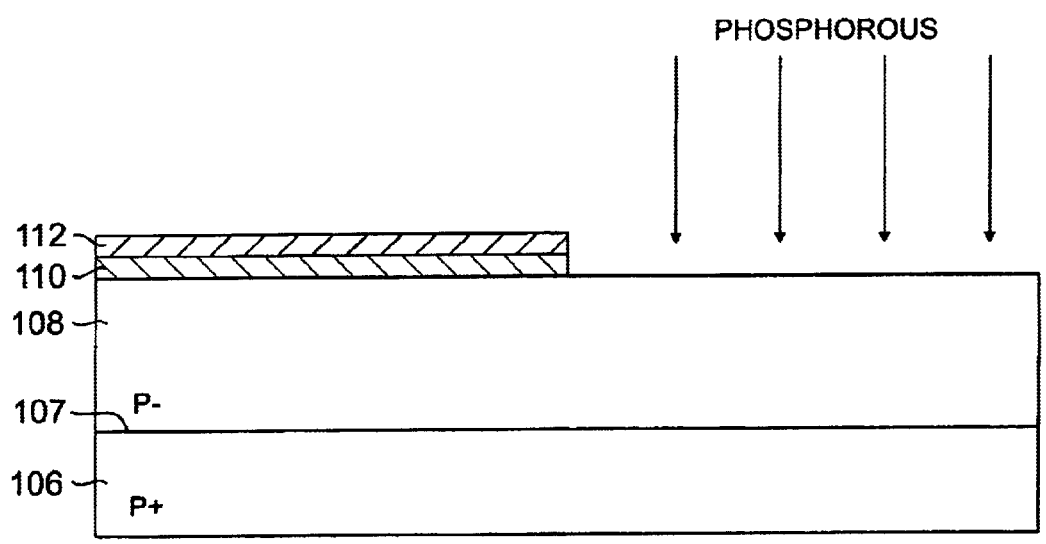

As shown in FIG. 4, a layer 110 of silicon dioxide ($Si_2O_4$) is deposited or grown, by conventional processes, over the epitaxial layer 108.

Next a layer 112, preferably of silicon nitride ($Si_3N_4$), is deposited over the silicon dioxide layer 110. See FIG. 5. Conventionally, the silicon nitride layer is formed by low pressure chemical vapor deposition to a thickness of approximately 20 nm.

The layers 110 and 112 are then covered by photo resist, and a window is opened by etching, for implanting an n-type region in this CMOS device. See FIG. 6. Using the layers 110 and 112 as a mask, phosphorous (or another donor material such as arsenic) is implanted to form the n region. Phosphorous is preferred to arsenic because it is lighter and has a higher projected implant range. Also, phosphorous diffuses faster in the epitaxial layer 108. This fast diffusion is advantageous to drive the dopants fairly deep into the epitaxial layer 108 to form the n region. The phosphorous can be implanted at a concentration in the range of 1E12 to 1E17 atoms/$cm^2$ with energies of about 1 KeV to 500 MeV.

Figure 7:
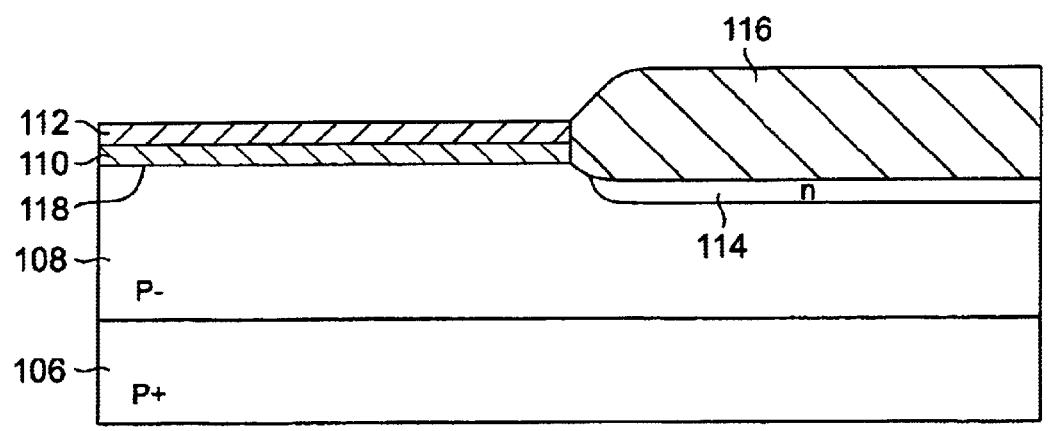

After the implantation process, a thin n region 114 is formed. A field or tank oxide layer 116 is then formed, for instance by wet oxidation, with a layer thickness of about 200 nm FIG. 7 illustrates the resulting tank oxide layer 116 formed over the remaining thin n-type layer 114. Formation of the tank oxide layer 116 consumes silicon from the underlying region of the epitaxial layer 108 and the resulting grown oxide therefore swells. This creates a discontinuity along a plane 118 that defines the bottom surface of the silicon dioxide layer 110, as shown in FIG. 7. Thus, the tank oxide layer 116 extends below the plane 118. Tank oxide does not grow substantially into the wafer region protected by the silicon nitride layer 112 as the silicon nitride blocks diffusion of the oxygen and water molecules, thereby preventing oxidation of silicon and the formation of silicon dioxide in that region.

Figure 8:
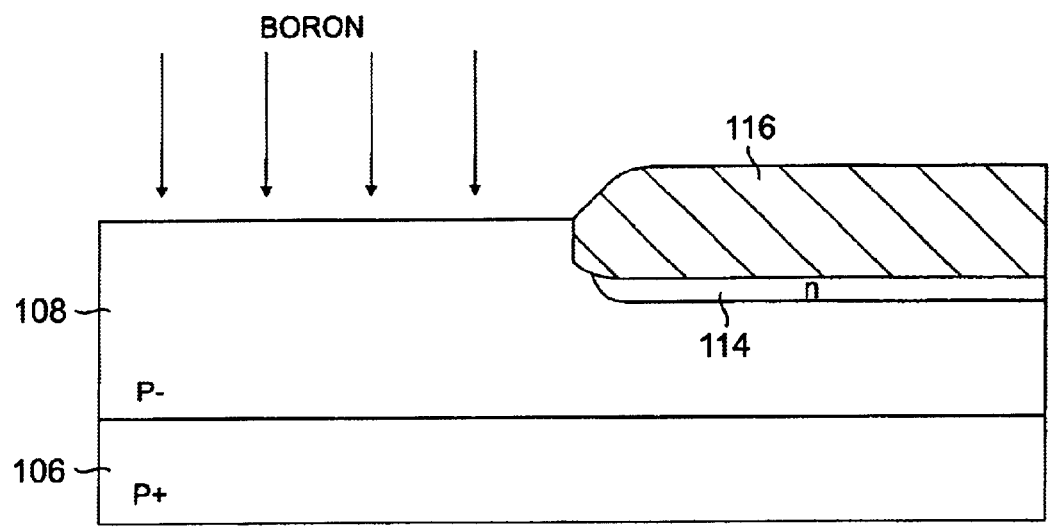

The silicon dioxide layer 110 and the silicon nitride layer 112 are removed by etching, as shown in FIG. 8. Using the tank oxide layer 116 as a self-aligned implant mask, a p-type region is formed by implanting boron (or another donor type material). The tank oxide layer 116 must be much thicker than the projected range of the boron implant to preclude boron implantation in the n region 114.

Figure 9:
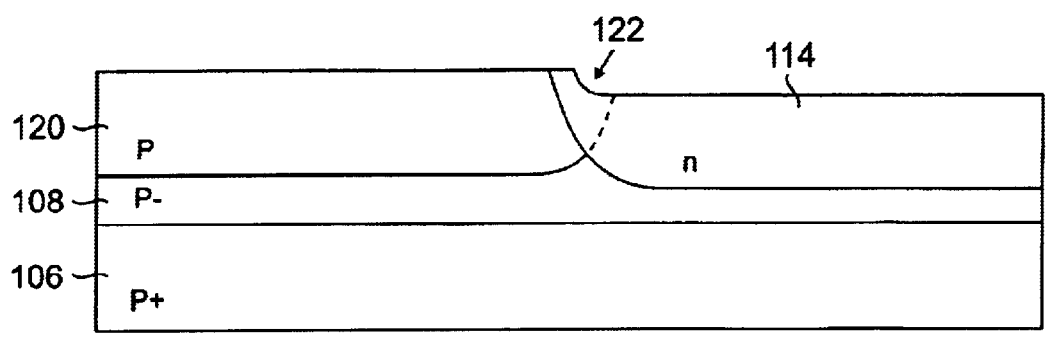
Figure 10:
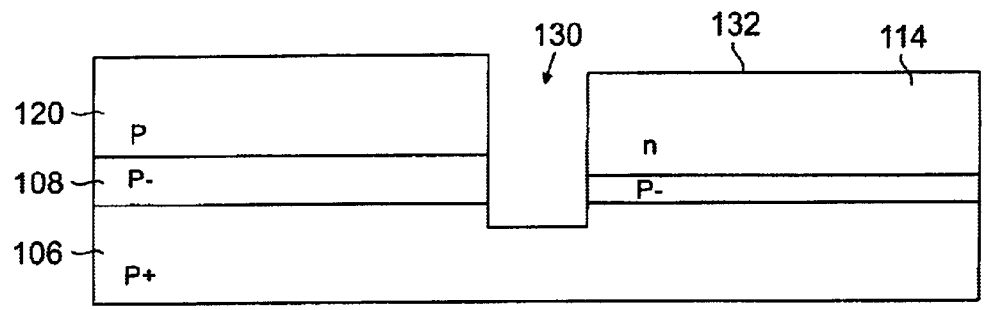

As shown in FIG. 9, both the phosphorous and boron implants are then diffused into the epitaxial layer 108 by a drive-in diffusion process at very high temperatures (about 1000° C.). After diffusion, the tank oxide layer 116 is removed. Since formation of the tank oxide 116 consumed silicon from the epitaxial layer 118, there is a resulting step 122, delineating the n-region 114 and the p-region 120.

Preferably, the PMOS and NMOS devices of the CMOS circuit are isolated through a shallow trench isolation process, wherein a trench 130 (See FIG. 10) is formed in a surface 132 by conventional techniques. The trench 130 provides electrical isolation between two regions over which an exemplary pair of complementary field-effect transistors are to be formed. The trench 130 is preferably formed by reactive ion etching to a depth of approximately 1 micrometer. In lieu of a trench, a local oxidation of silicon (LOCOS) process can be used to isolate the two transistors.

Figure 11:
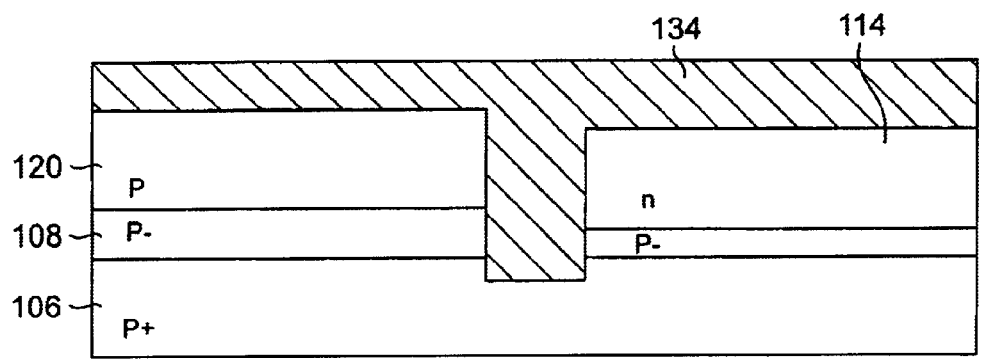

As shown in FIG. 11, the trench 130 is completely filled by depositing a silicon dioxide layer 134, for example by low pressure chemical vapor deposition. The device then undergoes chemical/mechanical polishing to planarize the upper surface, creating the resulting structure illustrated in FIG. 12.

Figure 12:
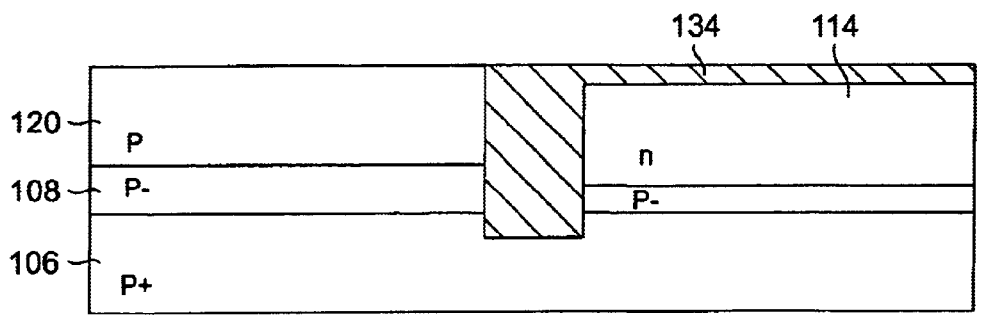
Figure 13:
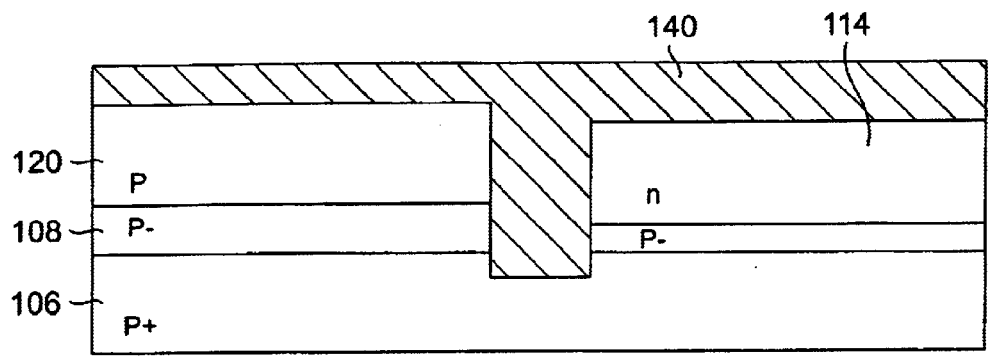
Figure 14:
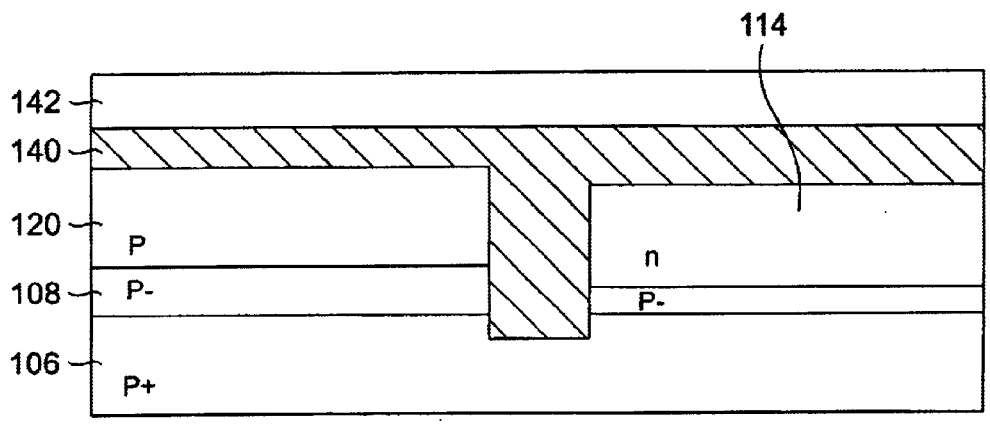
Figure 15:
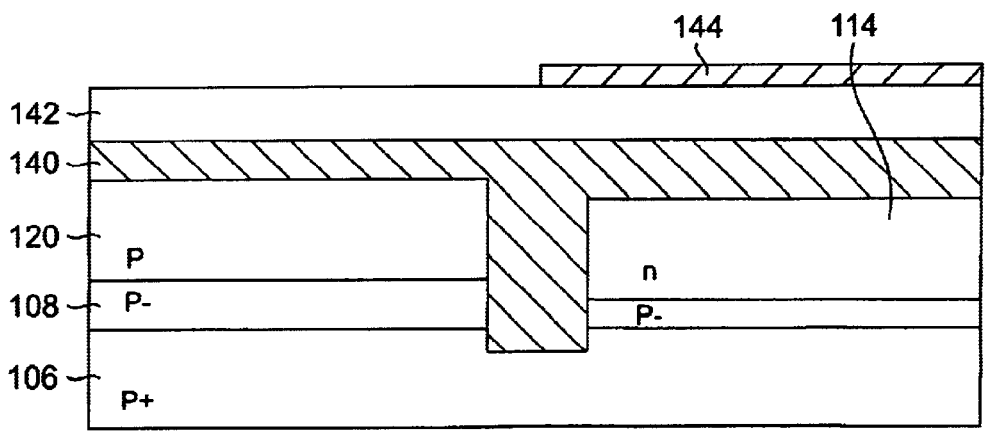

As shown in FIG. 13, a silicon dioxide layer 140 is deposited or formed over the entire device including the silicon dioxide layer 134 shown in FIG. 12. The silicon dioxide layer 140 insulates the source regions 114 and 120 from what will eventually be an overlying gate region. Thus the silicon dioxide layer 140 is composed of a material and has a thickness that is consistent with this insulating objective.

Next (See FIG. 14) an n-doped tetraethylene-orthosilicate (PTEOS) layer 142 is formed over the silicon dioxide layer 140. The PTEOS layer 142 is formed by the decomposition of a tetraethyl-ortho silicate precursor or TEOS, i.e., $Si(OC_2H_5)_4$. Decomposition of vaporized liquid TEOS to form a silicon oxide film (referred to herein as a TEOS-deposited oxide) typically occurs by chemical vapor deposition at 650° C. to 750° C. in an oxygen environment. Such TEOS depositions are known to provide good uniformity in step coverage when needed. Generally, the deposited film is understood to be a non-stoichiometoc oxide of silicon, although it is often referred to as silicon dioxide. Including ozone ($O_3$), e.g., up to 10% of the reacting oxygen, facilitates lower temperature depositions. A typical reaction, including ozone, is performed at 400° and 300° Torr with four standard liters per minutes oxygen, the oxygen comprising 6% ozone, 1.5 standard liters per minute helium and 300 standard cubic centimeters per minutes TEOS. It is known that the TEOS deposition can include a dopant, in this case donor dopant having a concentration in the rage of about 0.01% to 15%, for forming the PTEOS layer 142 as shown.

An etch stop, as is known to those skilled in the art, is designed to prevent an etch from proceeding to an underlying or overlying layer or layers. The etch stop therefore, has a significantly greater etch resistance to a selected etchant than the adjacent layer or layers to be etched away. Specifically in this case, for the selected etchant, an etch stop layer 144 has a much slower etch rate than the adjacent PTEOS layer 142. Thus, according to the present invention, portions of the PTEOS layer can be removed by etching, while the etch stop layer protects other portions. An appropriate etch stop material that limits action of the etchant on the underlying PTEOS layer is silicon nitride, shown by a reference character 144 in FIG. 15.

Figure 16:
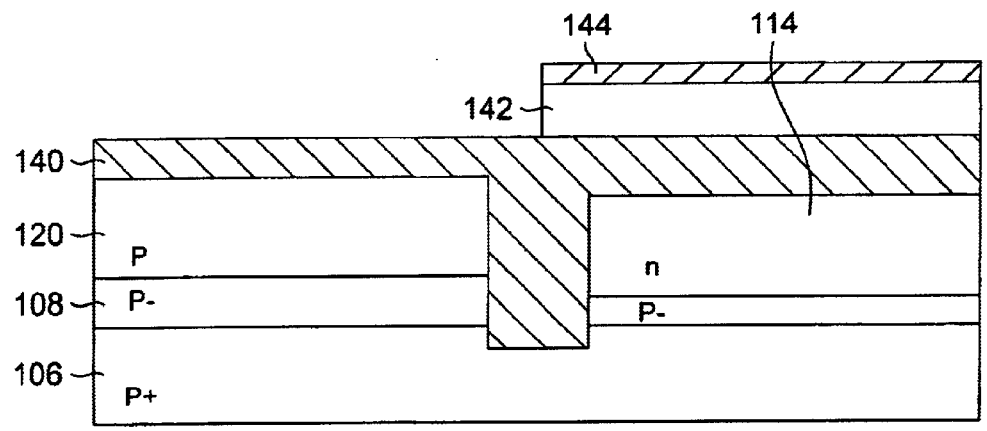

Using these silicon nitride layer 144 as an etch stop, a portion of the PTEOS layer 142 is removed as illustrated in FIG. 16. As shown, approximately half of the PTEOS layer 142 is removed, the portion remaining overlying the n region 114. As will be shown further below, the n region 114 forms a source/drain region of an n-channel MOSFET device; the p region 120 forms a source/drain region of a p-channel MOSFET device.

Figure 17:
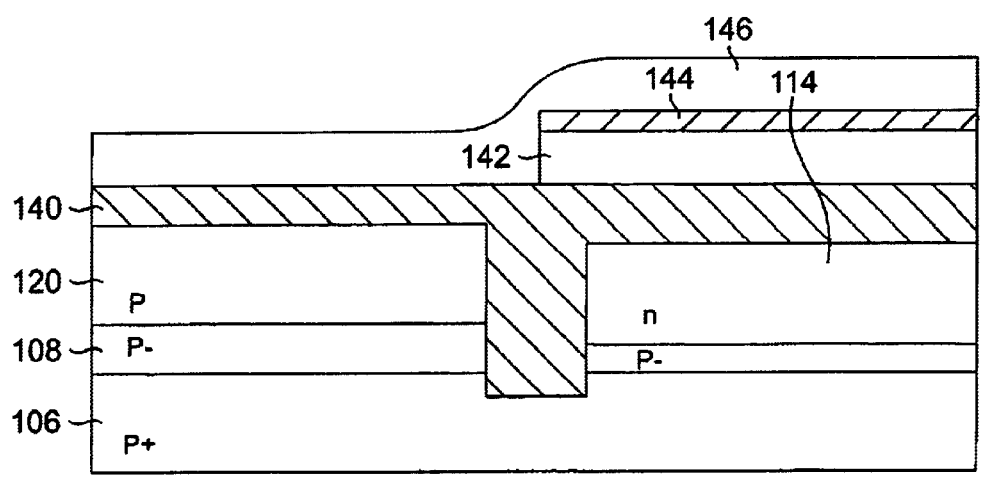

As shown in FIG. 17, a BTEOS (boron doped TEOS) layer 146 is formed over the exposed portion of the silicon dioxide layer 140 and the silicon nitride layer 144. The formation process is identical to that used to form the PTEOS layer above, with the exception that acceptor dopants are utilized instead of donor atoms.

Figure 18:
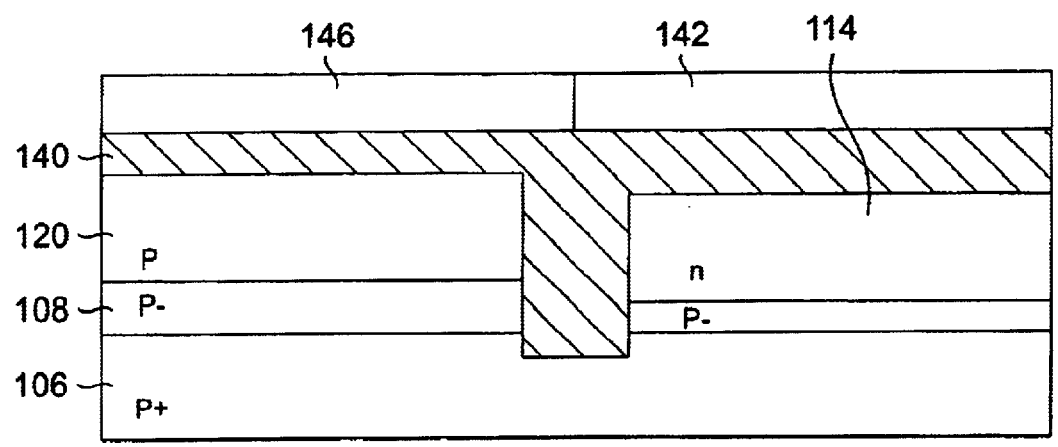

The portion of the BTEOS material overlying the n region 114 is removed by etching in a reactive ion etchant process. The silicon nitride layer 144 is similarly removed. The resulting structure, including both a BTEOS layer 146 overlying the p region 120, and a PTEOS layer 142 overlying the n region 114 is shown in FIG. 18.

An etch stop layer 150 (see FIG. 19) is formed over the PTEOS and BTEOS layers 142 and 146. Silicon nitride ($Si_3N_4$) is a suitable etch stop material. The thickness of the etch stop layer is dependent upon the resistance of the etch stop material to the selected etchant relative to the material thickness to be removed through the etching process. In addition to preventing the etchant from acting on the underlying layer, the etch stop layer 150 will later serve as a diffusion barrier to dopants used to form the source/drain extensions, thereby defining the spacing and the length of the source/drain extensions relative to the device gate. As will be discussed further below, the dopants forming the source/drain extensions, in one embodiment, are diffused from the PTEOS and BTEOS layers 142 and 146. In one embodiment, the etch stop layer 150 has a thickness ranging between about 5 nm and 50 nm.

Figure 19:
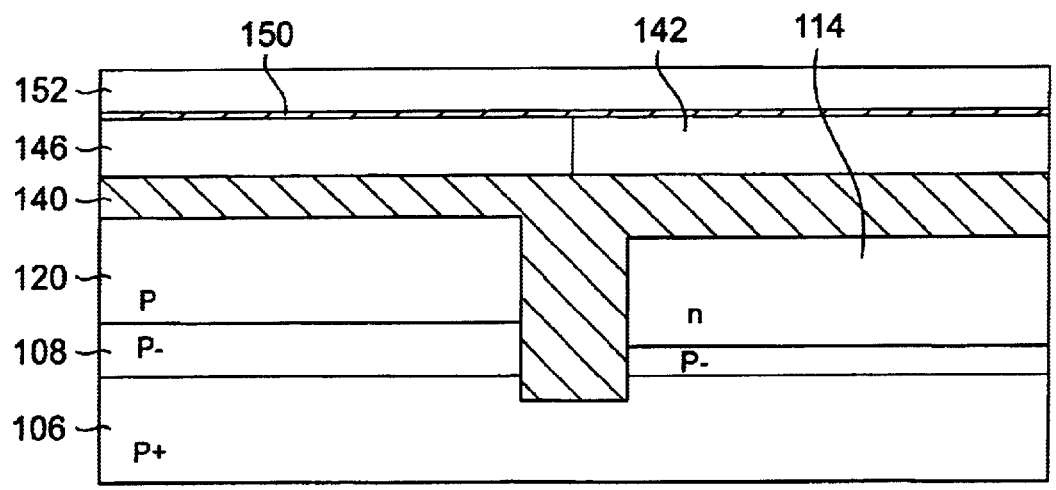
Figure 20:
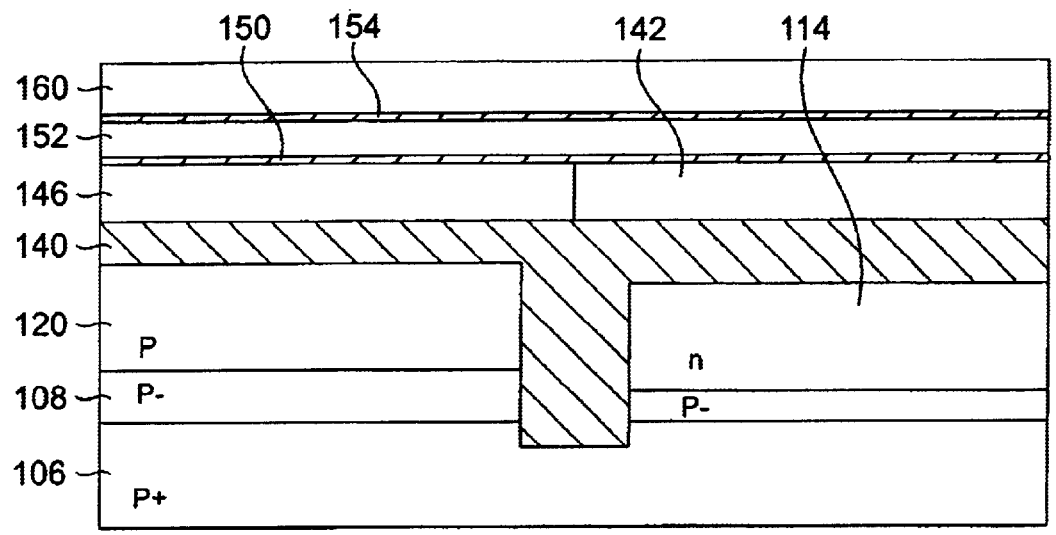

Also as shown in FIG. 19, a sacrificial layer 152 is formed (for example by a TEOS deposition process) over the etch stop layer 150. In subsequent processing steps, the sacrificial layer 152 is removed and the gates of the CMOS devices formed in the space vacated by the sacrificial layer 152. Thus, the material of the sacrificial layer 152 is chosen such that the etchant has a significantly higher selectivity to remove the sacrificial layer 152 relative to the etch stop layer 150. The thickness of the sacrificial layer 152 is selected to correspond to the desired channel length of the final MOSFET devices. Polycrystalline silicon is an example of a suitable material for the sacrificial layer 152. Silicon dioxide is also suitable.

An etch stop layer 154 is formed over the sacrificial layer 152. The etch stop layer 154 serves a similar purpose as the etch stop layer 150 and may, for example, be formed of silicon nitride.

A PTEOS insulating layer 160 is formed over the etch stop layer 154. Because it is advantageous that the PTEOS layer 160 have the same etch rate as the PTEOS layer 142 (for a common etchant), it is preferred that the PTEOS layers 142 and 160 be formed of the same material. Both of the PTEOS layers 142 and 160 will later serve as dopant sources in subsequent processing steps.

Figure 21:
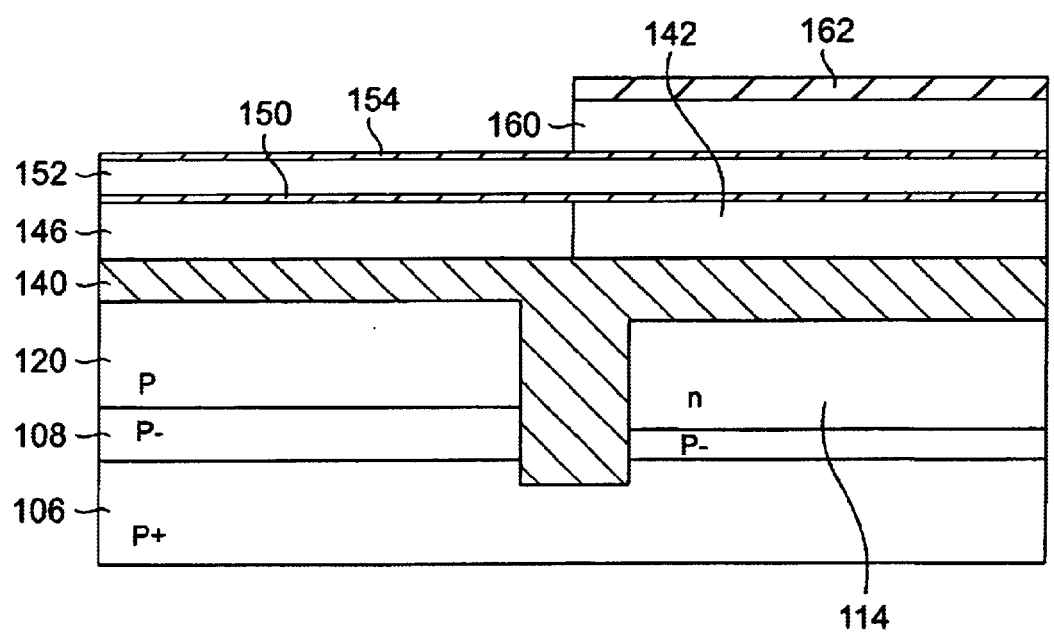

Next a silicon nitride layer 162 is formed over the PTEOS layer 160. Both the PTEOS layer 160 and the silicon nitride layer 162 are masked and etched, with the silicon nitride 154 serving as an etch stop. The resulting configuration is shown in FIG. 21.

Figure 22:
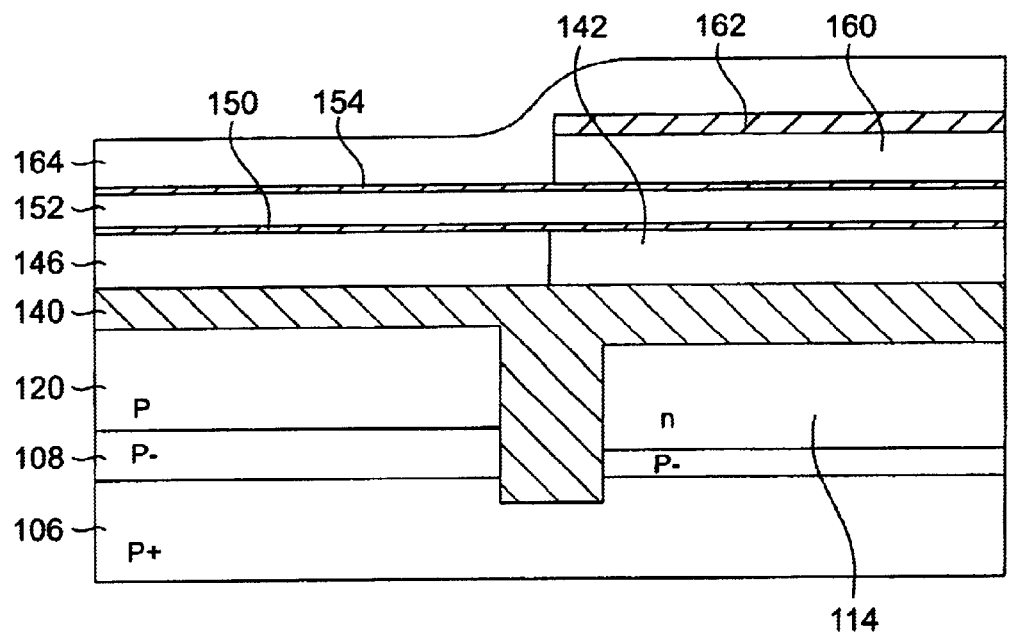
Figure 23:
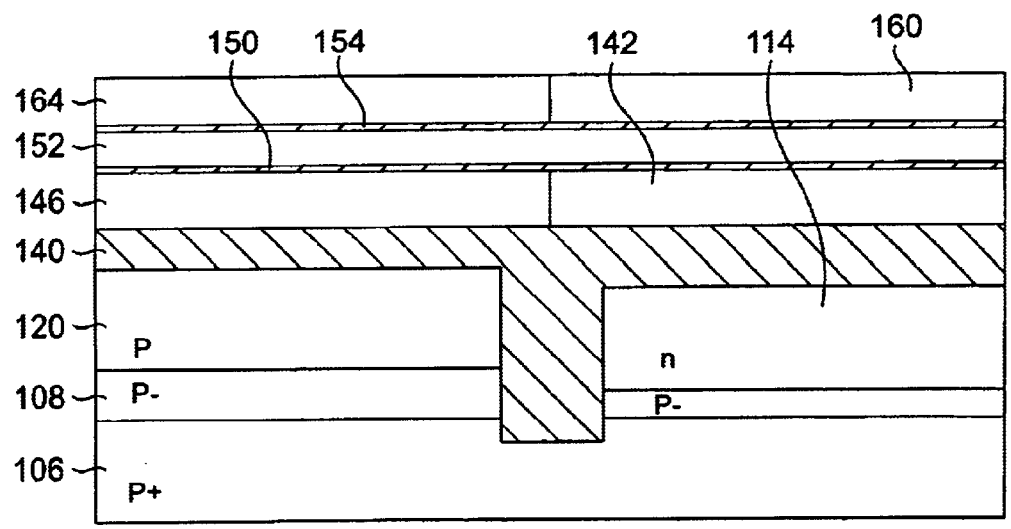

A BTEOS layer 164 is formed over the device, as shown in FIG. 22, overlying both the silicon nitride layer 154 and the silicon nitride layer 162 as shown. The BTEOS layer 164 is then masked and patterned (i.e., etched) to remove the material overlying the silicon nitride layer 162, with the silicon nitride layer 162 serving as an etch stop. Then the silicon nitride layer 162 is removed and the resulting structure is shown in FIG. 23. The BTEOS layer 164 overlies the left region of the sacrificial layer 152, and the PTEOS layer 160 overlies the right region of the sacrificial region 152. Both the BTEOS layer 164 and the PTEOS layer 160 serve to insulate the overlying drain regions to be formed as discussed below, from the underlying gate region, also formed as discussed below. Thus the material composition and thickness of the BTEOS layer 164 and the PTEOS layer 160 are selected to achieve this insulating objective, as well as considering that the extension regions are formed from the dopants in the BTEOS layer 164 and the PTEOS layer 160.

Although certain exemplary techniques have been described as preferable, all of the layers 142, 146, 150, 152, 154, 160 and 164 may be deposited using conventional chemical vapor deposition (CVD) processes or other well-known deposition techniques. With regard to the afore-described sequence of layers, it should be noted that other embodiments may include variations. For example, fewer deposited layers. In any case, the resulting structure will form two vertical channel regions. One for an n-channel MOSFET device and the other for a p-channel MOSFET device.

Figure 24:
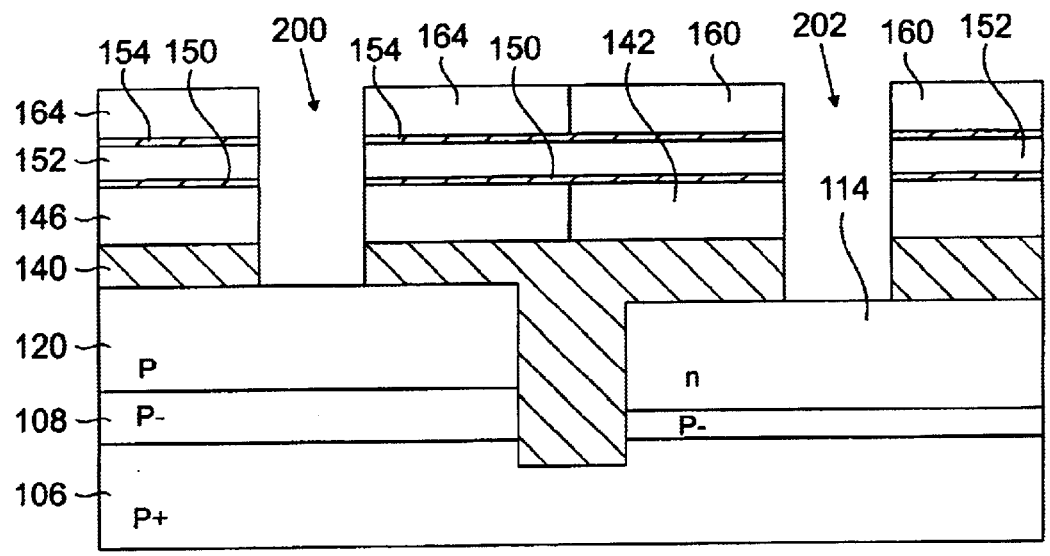

Referring to FIG. 24, an opening or window 200 is anisotropically etched through the BTEOS layers 146 and 164, the silicon nitride layers 150 and 154, the sacrificial layer 152 and the silicon dioxide layer 140. An opening or window 202 is anisotropically etched through the silicon dioxide layer 140, the PTEOS layers 142 and 160, the silicon nitride layers 150 and 154 and the sacrificial layer 152. The diameter of each window 200 and 202 is determined by the performance characteristics and size constraints for the device under fabrication and the limitations of the lithographic process utilized to form the windows 200 and 202. The lengths of the windows 200 and 202 (which are also referred to as trenches), i.e., the length being orthogonal to both the horizontal and vertical dimensions in the FIG. 24 cross section, is largely a matter of design choice and the window lengths are not necessarily identical. For a given horizontal dimension, the current capacity of the doped region that will be later formed in the windows 200 and 202 increases with increased window length.

In one embodiment, to dean the silicon on a bottom surface, the windows 200 and 202 are then subjected to a chemical cleaning process (e.g. RCA or Piranha-clean). As a result of this cleaning step, small portions of the insulating layer 140 forming a boundary with the windows 200 and 202 may be removed. The indentations thereby created are artifacts of the process and therefore not shown in FIG. 24.

Figure 25:
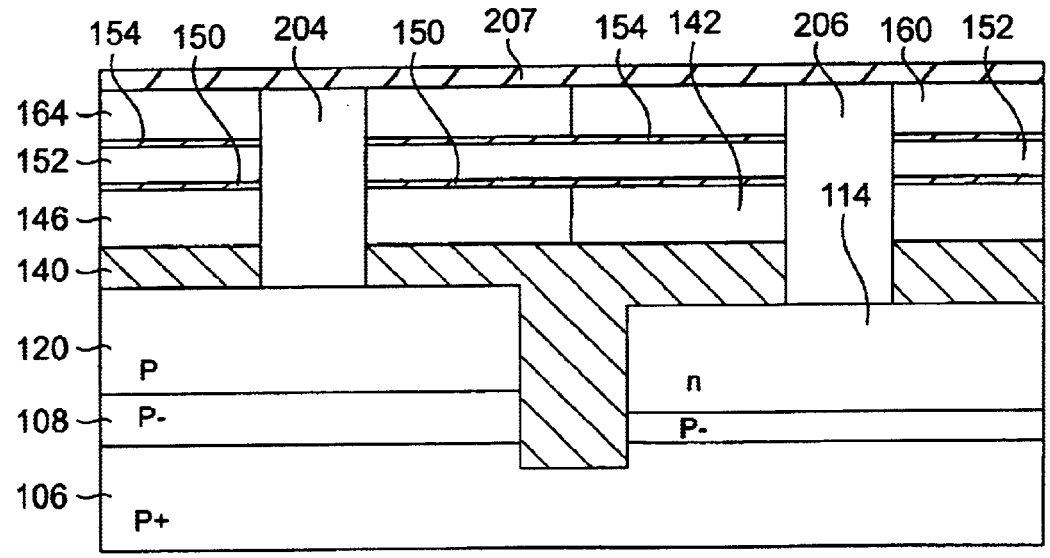

Referring to FIG. 25, the windows 200 and 202 are filled with a device-quality crystalline semiconductor material, e.g., 204 and 206, respectively. Other examples of crystalline semiconductor materials that can be utilized include silicon-germanium and silicon-germanium-carbon. The windows 204 and 206 can be formed in an undoped or lightly doped condition. Techniques for forming crystalline semiconductor material in windows are well known. For example, the crystalline semiconductor materials 204 and 206 can be epitaxially grown in the windows 204 and 206, using the p-type material 120 and the n-type material 114, respectively, as seed layers. In another embodiment amorphous or polycrystalline silicon can be deposited over the entire substrate 106, then all removed save the crystalline semiconductor 204 and 206 in the windows 200 and 202. The amorphous or polycrystalline semiconductor material is then annealed, e.g. with a laser, to recrystallize it. The crystalline semiconductor material 204 formed in the window 200 forms the channel of a p-channel MOSFET device. The crystalline semiconductor material 206 formed in the window 202 forms the channel of a n-channel MOSFET device. Therefore, the crystalline semiconductor material 204 and 206 must be doped to form the channel, as well as the source and drain extensions within the channel.

Dopants of one type (i.e., n-type or p-type) are introduced into the crystalline semiconductor materials 204 or 206 to form the source and drain extensions, and dopants of the opposite conductivity type are introduced into the crystalline semiconductor materials 204 and 206 to form the channel. A variety of techniques to dope the crystalline semiconductor materials 204 and 206 are contemplated as suitable. In situ doping of the crystalline semiconductor materials 204 and 206 during formation or implantation of dopants into the crystalline semiconductor materials 204 and 206 after formation are suitable processes. In situ dopant introduction, i.e., as a layer of material is formed during chemical vapor deposition, is well known and not described in detail herein. Note, the dopants are introduced into the atmosphere at the appropriate point in the deposition process to produce the desired concentration as a function of layer depth. To form the source/drain extensions, dopants may be diffused upwardly from the p-type region 120 and the n-type region 114 into the bottom of the respective crystalline semiconductor materials 204 and 206. Ion implantation is also suitable expedient for creating the source/drain extension regions at the top of the crystalline semiconductor materials 204 and 206. Also, as will be discussed below, the source/drain extension regions can be created by lateral diffusion from the PTEOS and BTEOS layers of the structure.

After the crystalline semiconductor materials 204 and 206 are doped and the dopants distributed therein in the desired manner, the integrated circuit structure should not be subjected to conditions that can significantly affect the dopant distribution therein. Preferably, but not necessarily, after this step the integrated circuit structure is not exposed to temperatures exceeding 1100° C. In fact, it is advantageous if the integrated circuit structure is not exposed to temperatures in excess of 1000° C. In certain embodiments, it is not exposed to temperatures that exceed 900° C. for prolonged periods of time (e.g., in excess of several minutes). However, the integrated circuit structure can be subjected to rapid thermal annealing at temperatures of about 1000° C. without adversely affecting the distribution of the dopants. Alternatively, the subsequent high temperature processing may in fact be designed to produce certain desired dopant distributions.

Depending upon the process used to form the crystalline semiconductor materials 204 and 206, a chemical/mechanical polishing step may be required to planarize the top surface thereof. The end result is illustrated in FIG. 25. To prevent dopants from the PTEOS layer 160 and the BTEOS layer 164 from diffusing upwardly when the source/drain regions are formed later, a silicon nitride layer 207 is formed over the entire structure, as shown in FIG. 25.

Windows are then etched in the silicon nitride layer 207 in preparation for the forming the next layer in the structure, i.e., a source/drain layer that must be in electrical contact with the crystalline semiconductor materials 204 and 206.

A conformal polysilicon layer 208 is formed over the silicon nitride layer 207 and the crystalline semiconductor materials 204 and 206. See FIG. 26. The polysilicon layer 208 provides a self-aligned top contact (the drain region in this embodiment). One example of a suitable material for the polysilicon 208 is doped polycrystalline silicon, wherein opposite-type dopants are introduced during separate masking and implanting steps. That is, the left side of the polysilicon layer 208 is masked and donor-type dopants implanted into the right side of the polysilicon layer overlying the n region 114, to create a drain region 208. Then the drain region 208 is masked and acceptor-type dopants are implanted into the left right side of the polysilicon layer overlying the p region 120, to create a drain region 210. Concentration of the dopant in the drain regions 208 and 210 is greater than about $1 \times 10^{20}$ atoms/cm$^3$. Alternatively, the polysilicon layer 210 can be formed in two separate process to form the n-type and the p-type regions.

Figure 26:
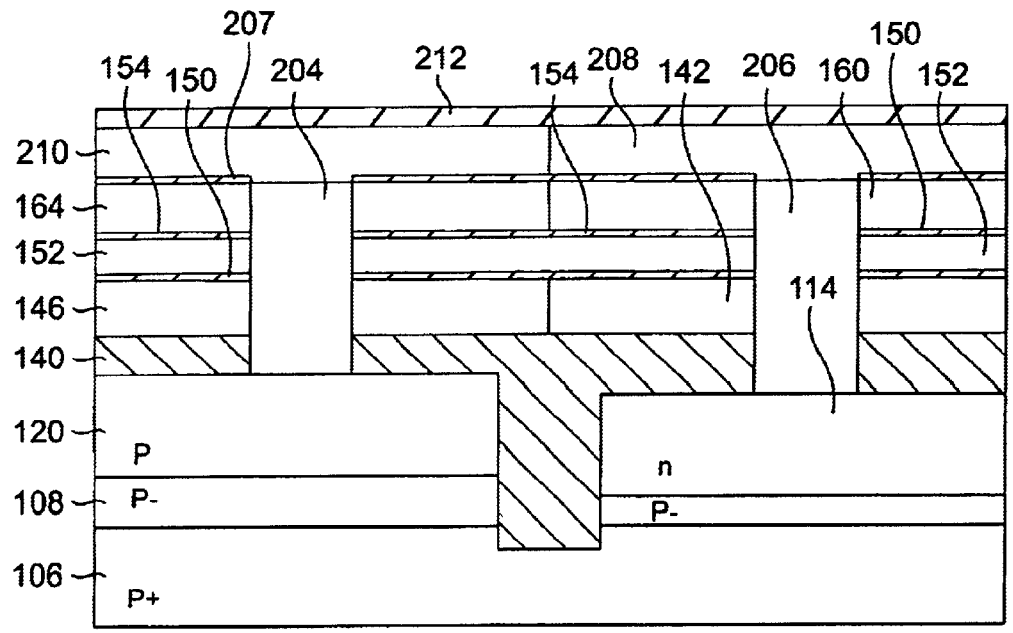

As further illustrated in FIG. 26, a conformal etch stop layer 212 is deposited over the n-type and p-type drain regions 208 and 210. The material selected for the etch stop layer 212 is selected to have an etch rate that is significantly lower than the etch rate of the sacrificial layer 152. Preferably, the material selected for the layer 212 is the same material as the etch stop layers 150 and 154, but preferably is thicker than the layers 150 and 154. One example of a suitable material is silicon nitride. The etch stop layer 212 is formed over the n-type and p-type drain regions 208 and 210 using known techniques.

Figure 27:
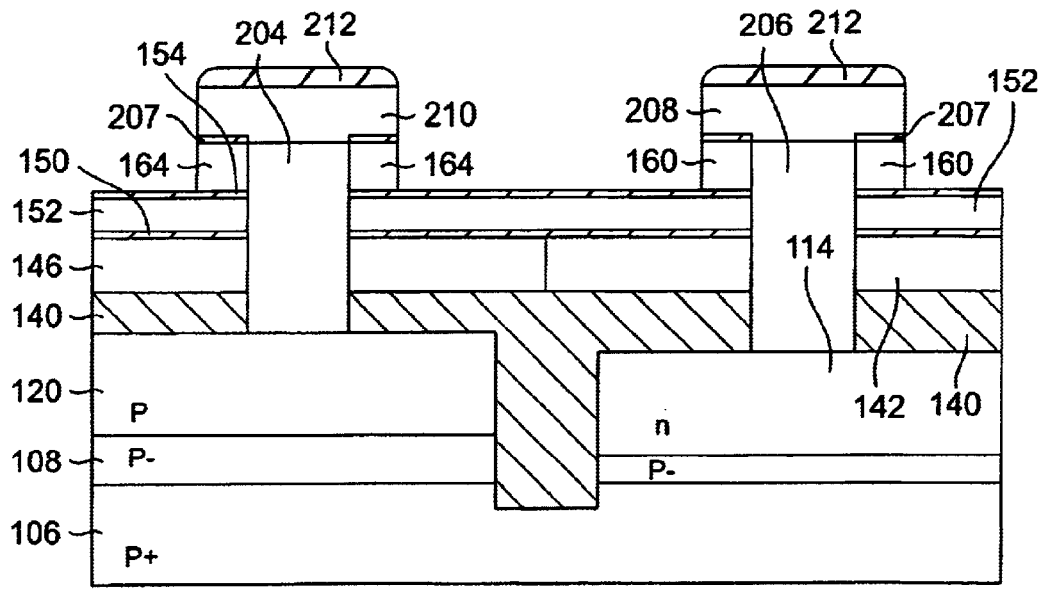

According to FIG. 27, using conventional lithographic techniques, the drain regions 208 and 210, the etch stop layer 212, the BTEOS layer 164 and PTEOS layer 160 are patterned, using one or more dry etch steps, so that the only remaining portions are those overlying or adjacent the crystalline semiconductor material 204 and 206.

Figures 28, 29:
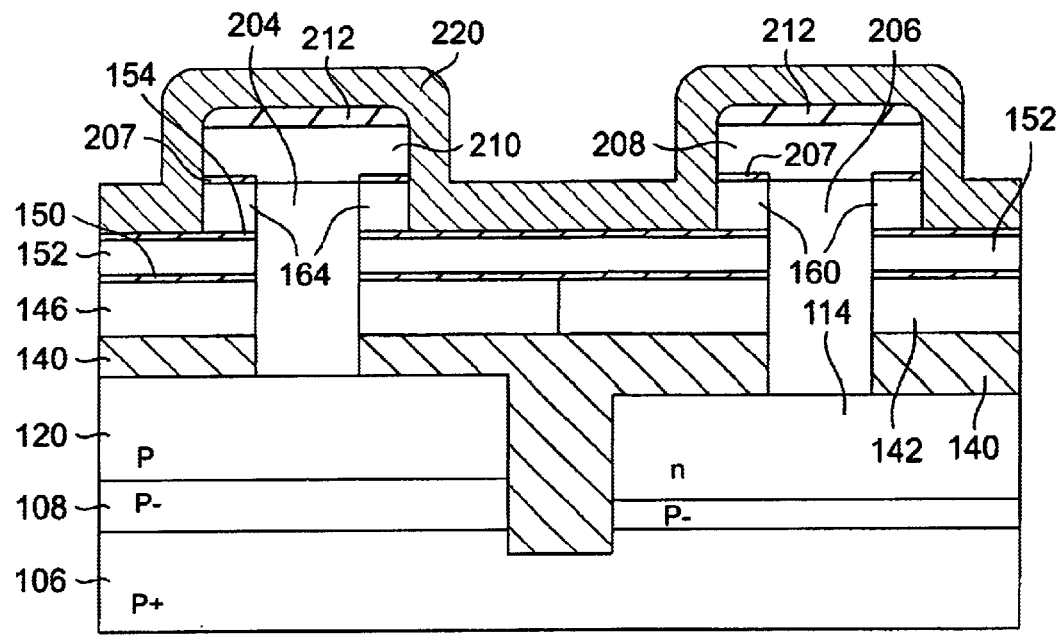

As illustrated in FIG. 28, a conformal etch stop layer 220 is then deposited. For a given etch chemistry, the material of the etch stop layer 220 is selected to have an etch rate that is significantly lower than the etch rate of the sacrificial layer 152. One example of a suitable material for the etch stop layer 220 is silicon nitride. The thickness of the etch stop layer 220 is selected so that the remaining portions of the drain regions 208 and 210, the PTEOS layer 160 and the BTEOS layer 164 are protected from contact with subsequent etchants.

The etch stop layer 220 is then etched using an anisotropric etch such as dry plasma etch, which also removes a portion of the etch stop layer 154. Therefore, as shown in FIG. 29, the only portions of the etch stop layer 220 that remain after the anisotropic etch are the sidewall portions laterally adjacent to the BTEOS layer 164 and the drain region 210, and also the sidewall portions laterally adjacent to the PTEOS layer 160 and the drain region 208. As a result of this etch process, the sacrificial layer 152 is now exposed, as portions of the etch stop layer 154 have been removed.

Figure 30:
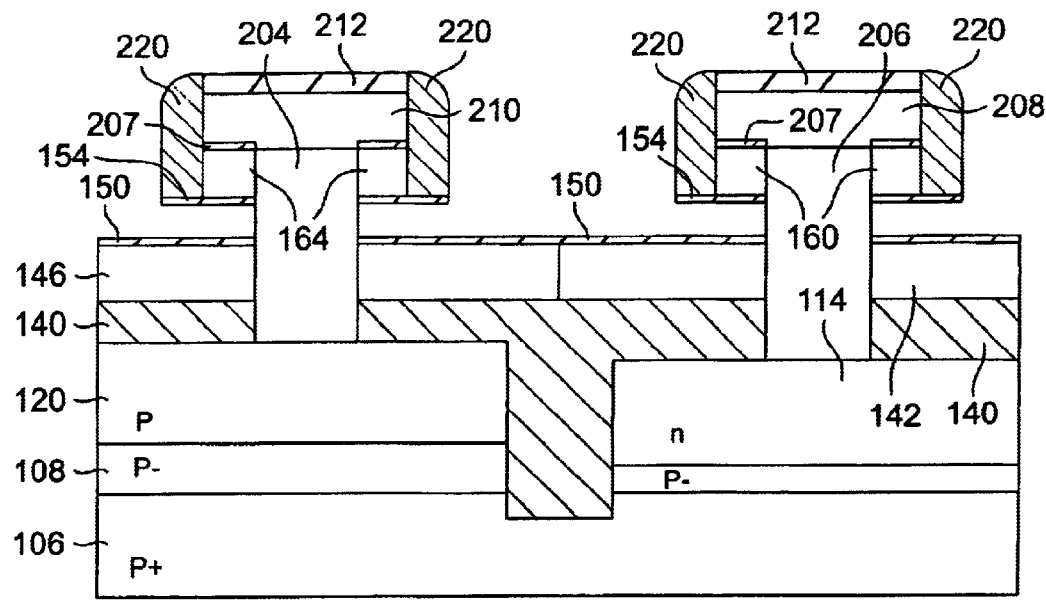

The substrate is then subjected to a wet etch (an aqueous hydrofluoric acid) or an isotropic dry etch (e.g., an anhydrous hydrofluoric acid) that removes the exposed remaining portions of the sacrificial layer 152, exposing portions of the crystalline semiconductor materials 204 and 206. The end result is illustrated in FIG. 30 where the PTEOS layer 142 and BTEOS layer 146 remain covered by the etch stop layer 150. On the left side of FIG. 30, the BThOS layer 164 and the drain region 210 are encapsulated by the remaining portions of the etch stop layer 154, 212 and 220. On the right side of FIG. 30, the PTEOS layer 160 and the drain region 208 are also encapsulated by the remaining portions of the etch stop layers 154, 212 and 220. Consequently, the remaining portions of the PTEOS layer 160, the BTEOS layer 164, and the drain regions 208 and 210 remain isolated from contact with subsequent etch expedients.

According to one embodiment of the present invention, a sacrificial layer of thermal silicon dioxide is grown on the exposed surface of the crystalline semiconductor materials 204 and 206, to a thickness of about less than 10 nm. The sacrificial silicon dioxide is then removed using a conventional isotropic etch, e.g., an aqueous hydrofluoric acid. As a result of the formation and then the removal of the sacrificial silicon dioxide, the surface of each of the crystalline semiconductor materials 204 and 206 is smoother and some of the sidewall defects are removed. The etch stop layers 150 and 154 prevent the etch expedient used to removed the thermal silicon dioxide from contacting the BTEOS layers 146 and 164 and the PTEOS layers 142 and 160. This step is not necessarily required the for the device fabrication but it can be useful for improving the gate dielectric properties by, for example, reducing interface traps. The step may be omitted if the silicon defects are known not to be detrimental for the device being fabricated.

Figure 31:
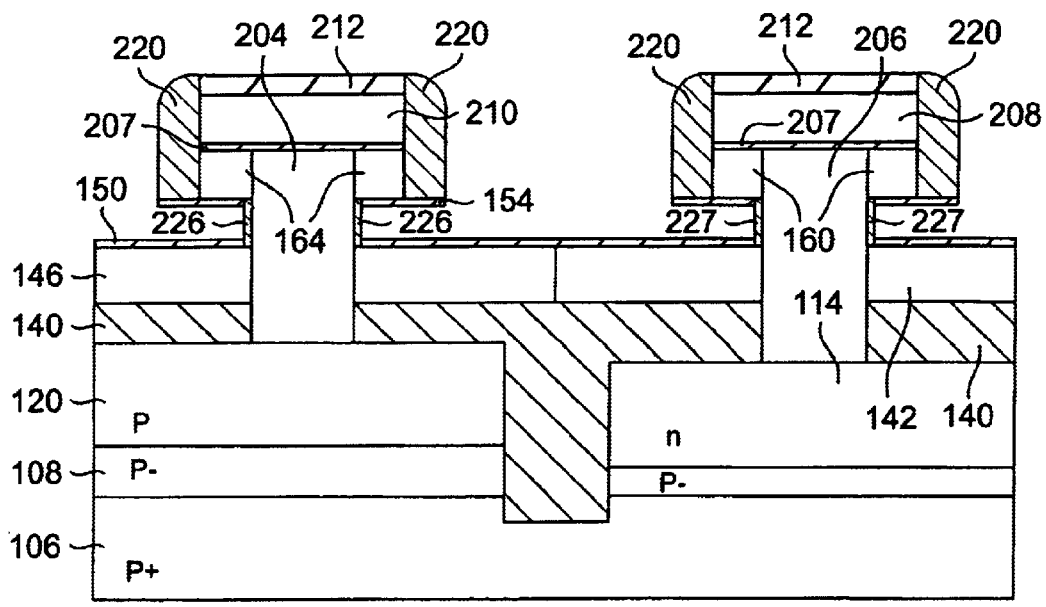

The exposed portion of the crystalline semiconductor material 204 defines the physical channel length of the p-channel MOSFET device that is being formed. The exposed portion of the crystalline semiconductor material 206 defines the physical channel length of the n-channel device that is being formed. As shown in FIG. 31, a layer of gate dielectric 226 is formed on the exposed portion of the crystalline semiconductor material 204 and a gate dielectric gate dielectric 227 is formed on the exposed portion of the crystalline semiconductor material 206. Suitable dielectric materials include, for example, thermally-grown silicon dioxide, silicon oxynitride, silicon nitride and metal oxide. The thickness of the gate dielectrics 226 and 227 is about 1 nm to about 20 nm. One example of a suitable thickness is 6 nm. In one embodiment the silicon dioxide layer forming the gate dielectrics 226 and 227 are grown by heating the integrated structure to a temperature in a range of about 700° C. to about 1000° C. in an oxygen-containing atmosphere. Other expedients for forming the gate dielectrics 226 and 227 may include chemical vapor deposition, jet vapor deposition or atomic layer deposition, all of which are contemplated as suitable. Conditions for forming the gate dielectrics 226 and 227 of the desired thickness are well known to those skilled in the art.

Figure 32:
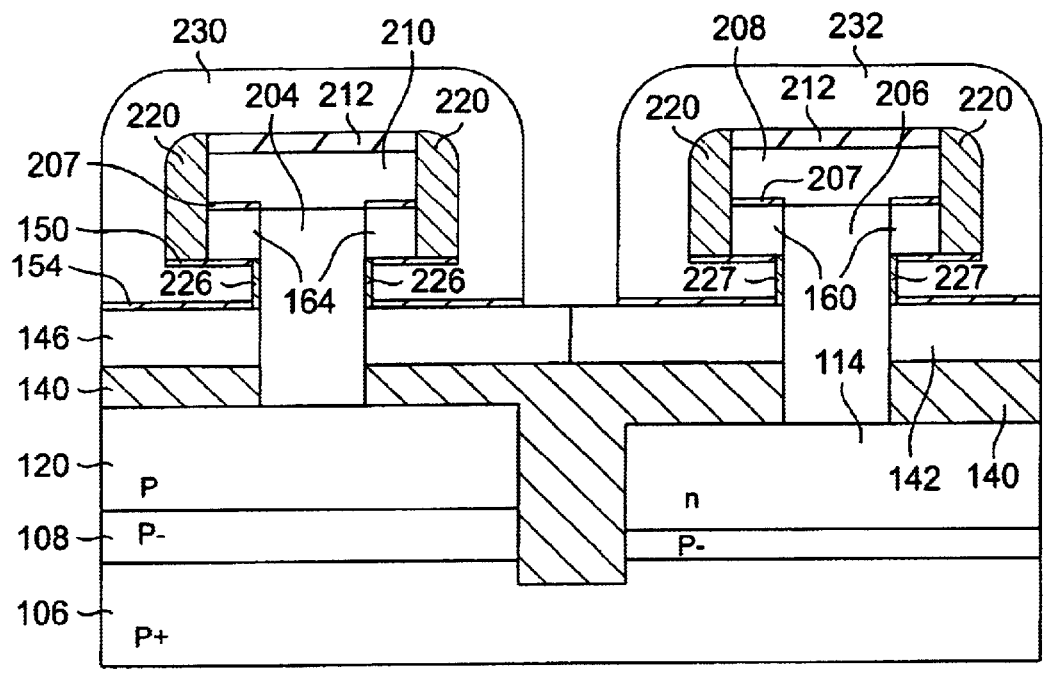

Referring to FIG. 32 in the region of the p-channel MOSFET, a gate electrode 230 is formed surrounding the gate dielectric 226, by depositing a layer of sufficiently conformal and suitable gate material. For example, a layer of doped amorphous silicon in which the dopant is introduced in situ, is deposited and then crystallized to form doped polysilicon crystalline. This step must be accomplished so that it does not significantly affect the dopant profiles in the crystalline semiconductor materials 204 and 206. Other examples of suitable gate electrode materials includes silicon-germanium and silicon-germanium-carbon. Metals and metal-containing compounds that have a suitably low resistivity and are compatible with the gate dielectric material and the other semiconductor processing steps are also contemplated as suitable gate electrode materials. It is advantageous that the gate material has a work function near the middle of the band gap of the crystalline semiconductor material 204. Examples of such materials include titanium, titanium nitride, tungsten, tungsten silicide tantalum, tantalum nitride and molybdenum. Suitable expedients for forming the gate electrode material include chemical vapor deposition, electroplating and combinations thereof. Similarly, a gate electrode 232 is formed in the region of the n-channel MOSFET and surrounding the gate dielectric 227.

Figure 33:
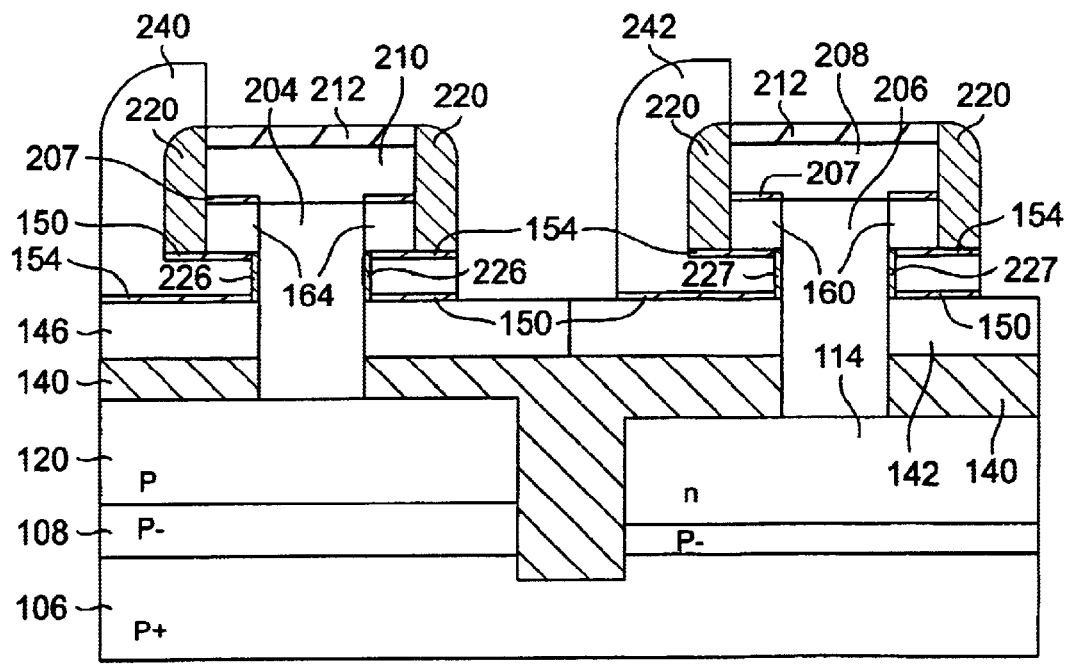

Referring to FIG. 33, the layers 230 and 232 are patterned (i.e., etched and masked) to form a gate 240 of the p-channel MOSFET device and a gate 242 of the n-channel MOSFET device. The gate configuration is largely a matter of design choice. The gates 240 and 242 surround a portion of the crystalline semiconductor materials 204 and 206, which form the channels of the respective devices.

Figure 34:
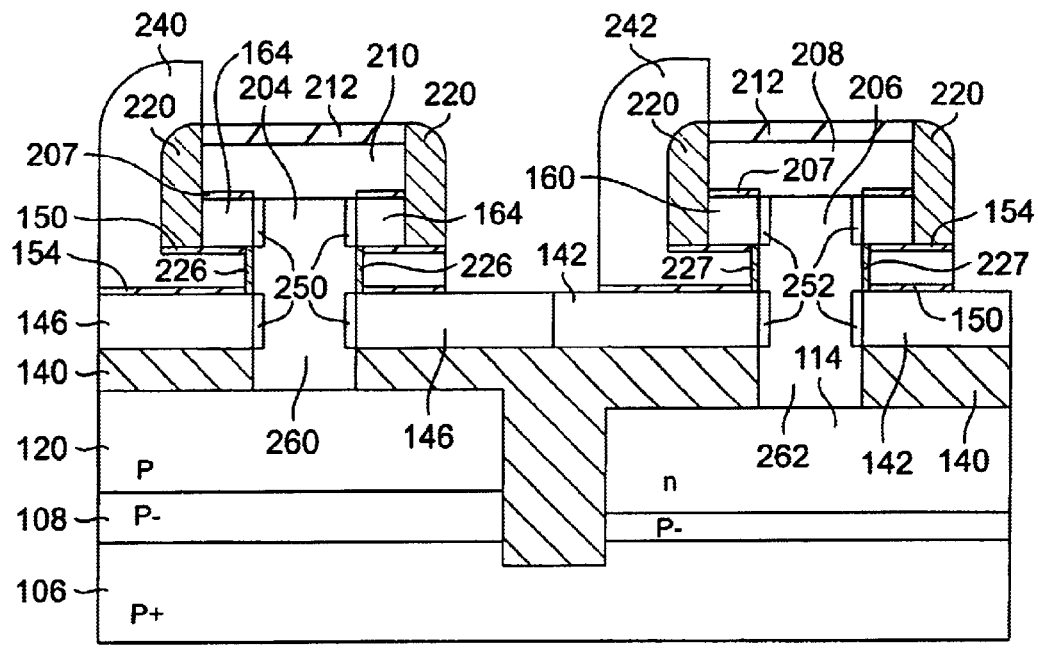

FIG. 34 shows the finished n- and p-channel MOSFET device structures. P-type dopants are then driven into the crystalline semiconductor material 204 by solid phase diffusion from the BTEOS layers 146 and 164 to form source/drain extensions 250. N-type dopants are driven into the crystalline semiconductor material 206 by solid phase diffusion from the PTEOS layers 142 and 160 to form source/drain extensions 252 of the p-channel MOSFET device. In the solid phase diffusion process, an oxide (e.g., silicon oxide) serves as the dopant source. At elevated temperatures, the dopant is driven from the doped oxide to the adjacent undoped (or lightly doped) regions of the crystalline semiconductor materials 204 and 206. This technique is advantageous because the doped area, and thus the extensions, are defined by the interface between the crystalline semiconductor materials 204 and 206 and the BTEOS/PTEOS layers 146 and 164/142 and 160. This process also allows the formation of self-aligned source/drain extensions (ie., the source/drain extensions are aligned with the gate). Examples of solid phase diffusion techniques are described in Ono, M., et al, Sub-50 nm Gate Length N-MOSFETs with 1 nm Phosphorus Source and Drain Junctions, IEDM 93, pp. 119–122, (1993) and Saito M., et al, An SPDD D-MOSFET Structure Suitable for 0.1 and Sub 0.1 Micron Channel Length and Its Electrical Characteristics, IEDM 92, pp. 897–900 (1992), which are hereby incorporated by reference.

The concentration of the dopant in the source/drain extensions 250 and 252 is typically about at least $1 \times 10^{19}/cm^3$, with dopants concentrations of about $5 \times 10^{19}/cm^3$ contemplated as advantageous. Using this solid phase diffusion technique, very shallow source and drain extensions are obtainable. The source/drain extensions 250 and 252 are shown as penetrating into the crystalline semiconductor materials 204 and 206, respectively, preferably less than one-half width of the crystalline semiconductor materials 204 and 206. Limiting the dopant penetrations in this manner avoids significant overlap of the doped regions from opposite sides of the crystalline semiconductor materials 204 and 206. Also, the distance that the source/drain extension 250 and 252 extend under the gate is preferably limited to one-fourth of the gate length. In the resulting structure, the net concentration of dopants in the source/drain extensions 250 and 252 are of the opposite type than present in the channels to 260 and 262. The silicon dioxide layer 140 prohibits the downward movement of the dopants from the BTEOS layer 146 and the PTEOS layer 142 into the p-type region 120 and the n-type region 114, respectively, and then upwardly into the crystalline semiconductor materials 204 and 206 respectively. The etch stop layer 150 prevents the upward diffusion of the dopants from the BTEOS layer 146 into the gate 240 and from the PTEOS layer 142 into the gate 242. The etch stop layer 154 prevents the downward diffusion of dopants from the BTEOS layer 164 into the gate 240 and from the PTEOS layer 160 into the gate 242.

Figure 1:
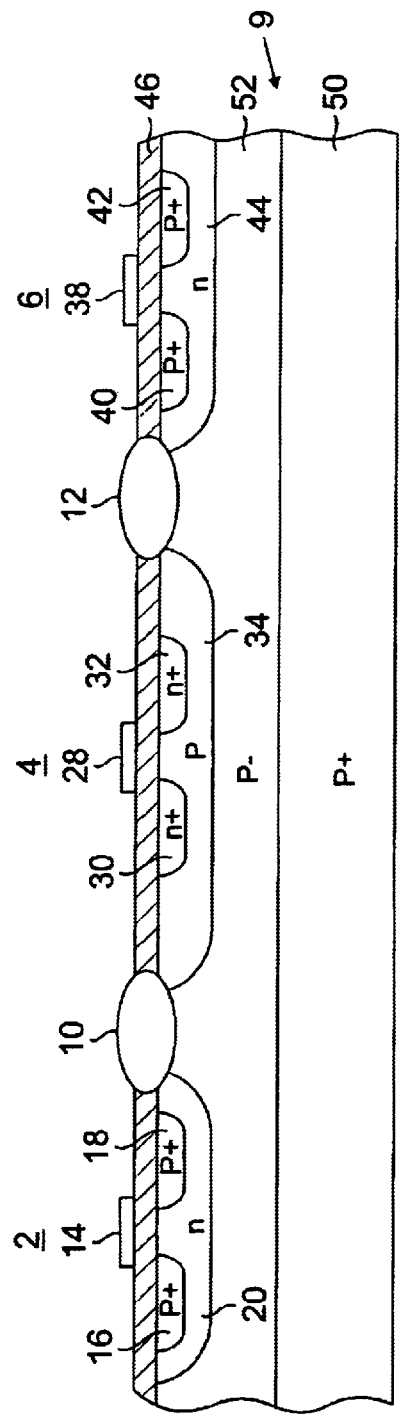
FIG. 1 is a cross-sectional view of a prior art CMOS integrated circuit.
Figure 2:
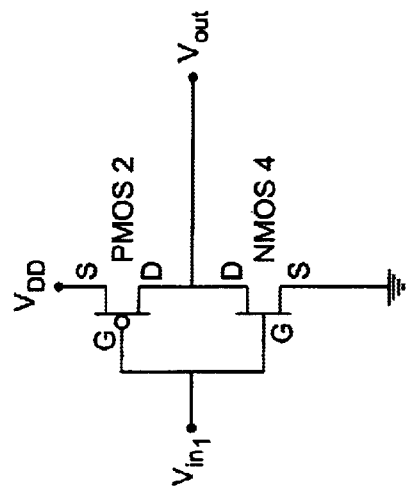
FIG. 2 is a schematic of an inverter circuit formed from CMOS devices.
Figure 41:
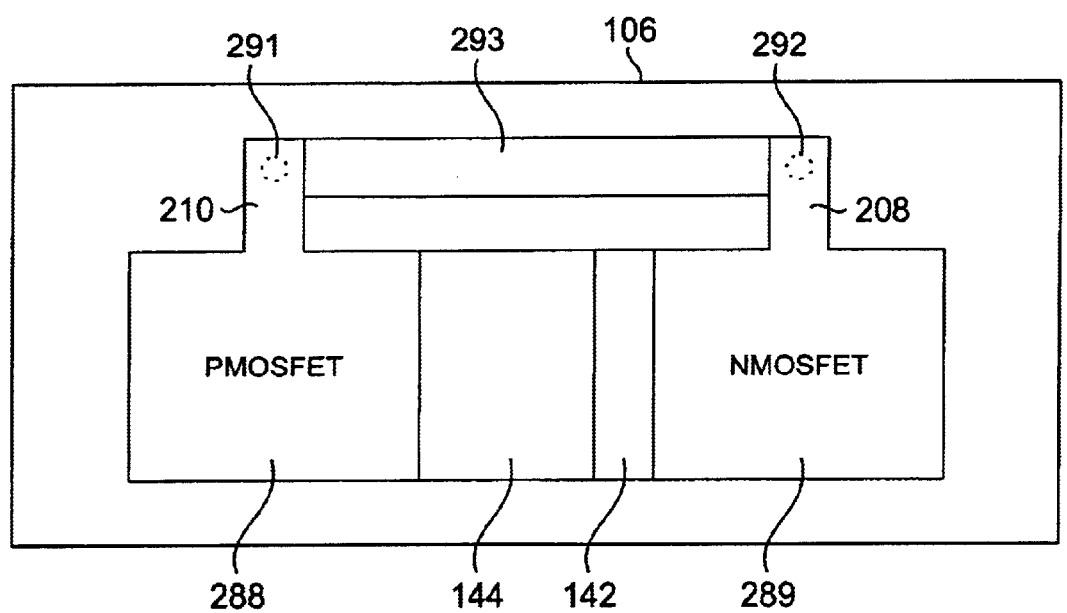
FIG. 41 is a plan view of certain elements illustrated in the cross-sectional view of FIG. 34.

To form the CMOS circuit of FIG. 2, the drain regions 208 and 210 are electrically connected in the third dimension, i.e., outside of the two dimensions depicted in the cross-sectional views of the Figures. FIG. 41 illustrates a PMOSFET 288 (comprising the elements on the left side of FIG. 34) and an NMOSFET 289 (comprising the elements on the right side of FIG. 34) in a plan view. The drain regions 208 and 210 are connected by vertical conductive vias 291 and 292 and a conductor 293 formed in a metallization layer overlying the PMOSFET 288 and the NMOSFET 289. The electrical connection between the drain regions 208 and 210 is similar to the connection between the drain of PMOS 2 and the drain of NMOS 4 of FIG. 2. The source contacts are also accessed in the third dimension.

Figure 40:
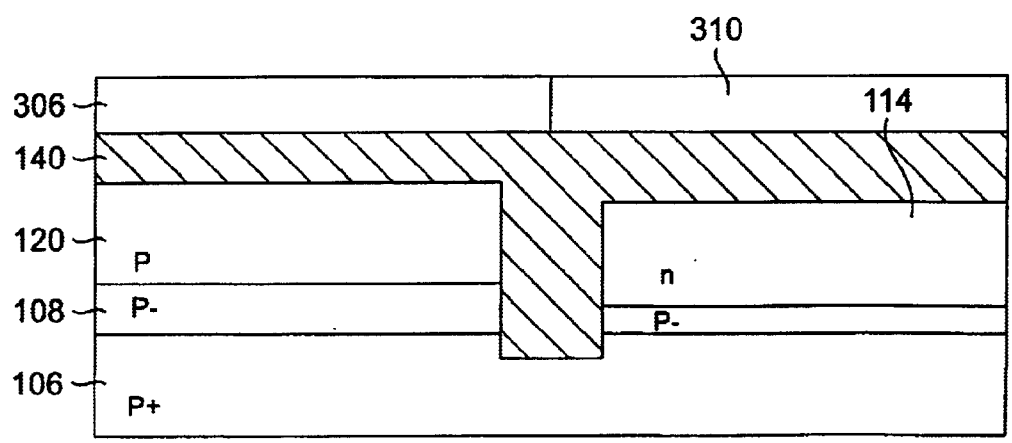
FIGS. 35 through 40 illustrate, in cross-section, a circuit structure according to a second embodiment of the invention during sequential fabrication steps.
Figure 35:
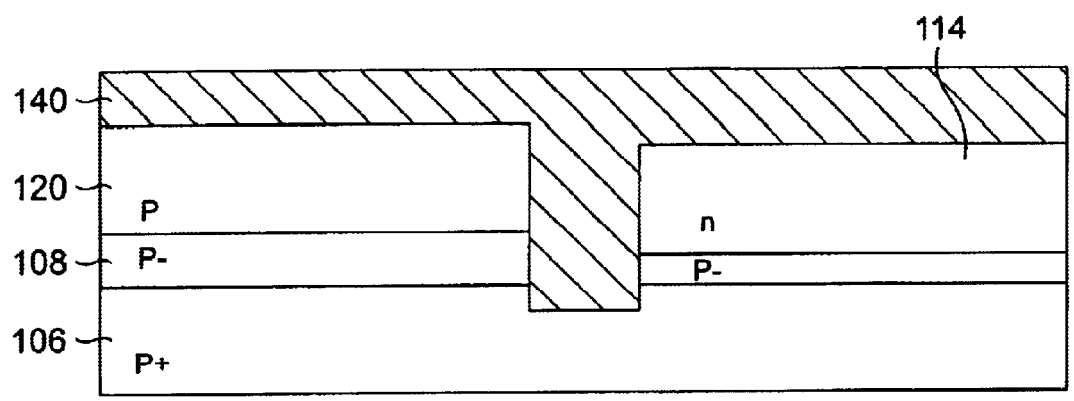
Figure 36:
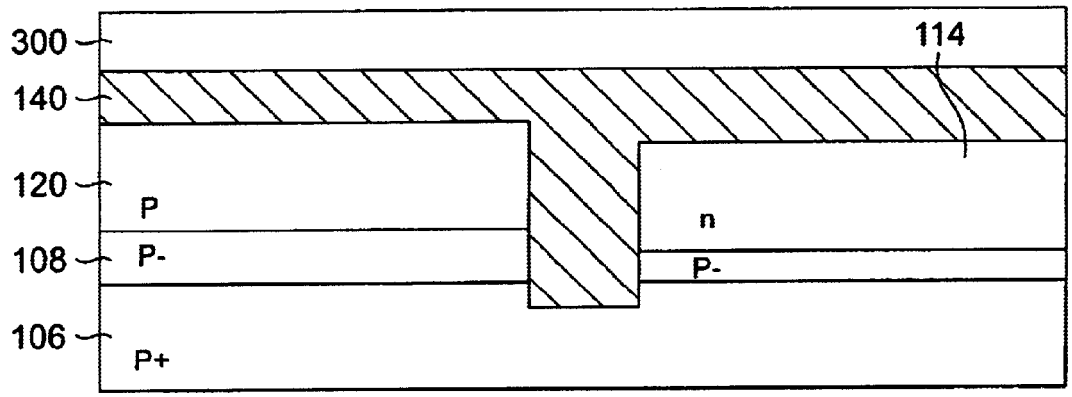
Figure 37:
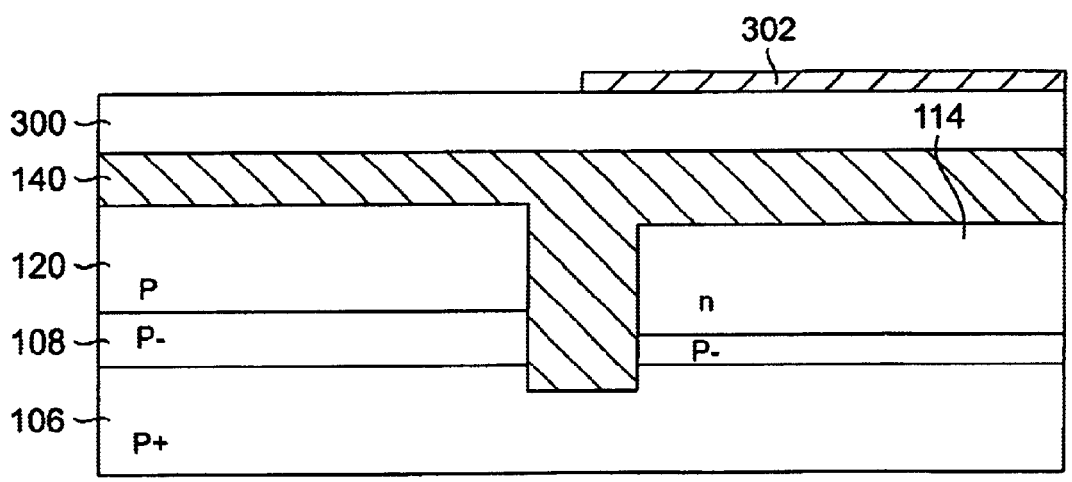
Figure 38:
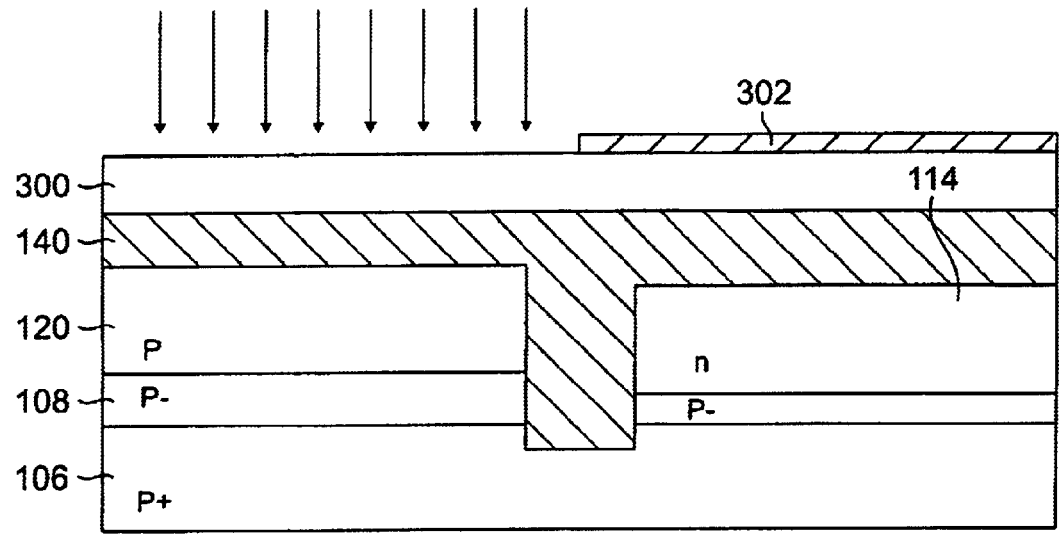
Figure 39:
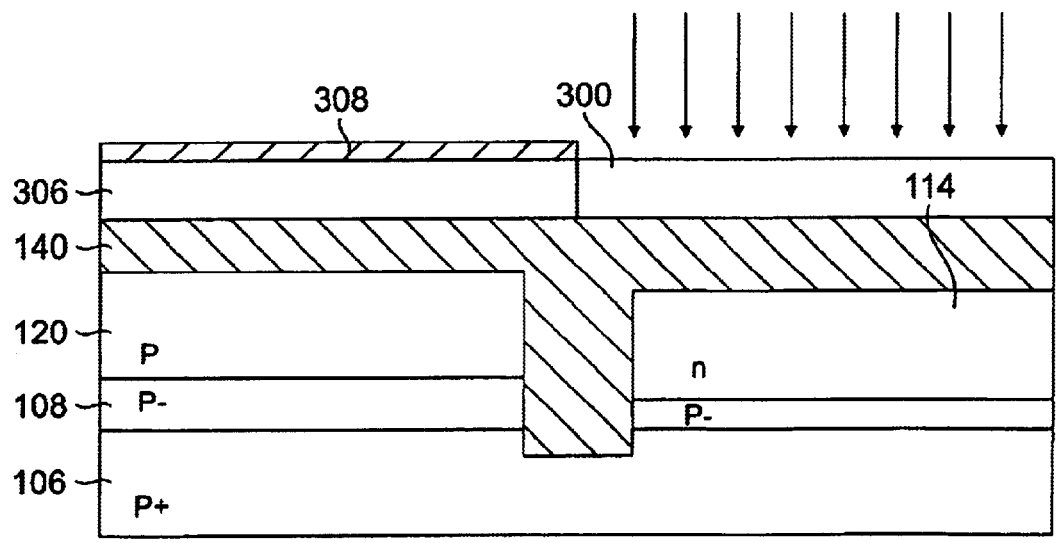

An alternative embodiment presents a second fabrication methodology replacing the fabrication steps illustrated in FIGS. 14 through 17. FIG. 35 illustrates the integrated circuit device prior to initiating the alternative fabrication process. Note that FIG. 35 is identical to FIG. 13. A TEOS layer 300 is deposited over the structure as shown in FIG. 36. A silicon nitride layer 302 is then deposited, masked and etched so that the remaining silicon nitride overlies only the n-region 114. See FIG. 37. In FIG. 38, acceptor impurities (e.g., boron) are implanted into the unmasked portion of the TEOS layer 300, forming a BTEOS layer 306, as shown in FIG. 39. Another silicon nitride layer is formed on the structure and patterned such that a silicon nitride layer 308 remains only above the BTEOS layer 306. Donor type impurities are then implanted into the exposed portion of the TEOS layer 300. Phosphorous is a preferred donor type and thus a PTEOS layer 310 is formed as shown in FIG. 40. The structure of FIG. 40 is identical to the structure of FIG. 18 where the BTEOS layer 306 represents the BTEOS layer 146 in FIG. 18 and the PTEOS layer 310 represents the PTEOS layer 142 in FIG. 18. At this point, the process continues beginning with FIG. 19 and concluding with FIG. 34. A similar nitride-implant-nitride-implant process can be used to form the PTEOS layer 160 and the BTEOS layer 164 of FIG. 23.

An architecture and process have been described as useful for forming p-channel and n-channel MOSFETs that are connected to form a CMOS device. While specific applications of the invention have been illustrated, the principles disclosed herein provide a basis for practicing the invention in a variety of ways in a variety of circuit structures, including structures formed with Group III-V compounds and other semiconductor materials. Although the exemplary embodiments pertain to voltage replacement gate MOSFETs, numerous variations are possible within the scope of the invention, which is limited only by the claims that follow.

What is claimed is:

1. An integrated circuit structure comprising:
   a semiconductor layer having a major surface formed along a plane;
   a first and a second spaced-apart doped region formed in the surface;
   an isolation region disposed overlying and between said first and said second regions for electrically insulating said first and said second regions;
   a plurality of layers overlying said isolation region, including a first and a second trench therein, wherein said first and said second trenches extend through said isolation region;

a third doped region formed in said first trench over said first doped region, and of a different conductivity type than said first doped region;

a fourth doped region formed in said second trench over said second doped region, and of a different conductivity type than said second doped region;

a first oxide layer proximate said third doped region; and a second oxide layer proximate said fourth doped region.

2. The integrated circuit structure of claim 1 wherein the first doped region is a first source/drain region of a first MOSFET and the third doped region is a channel region of the first MOSFET, and wherein the second doped region is a first source/drain region of a second MOSFET and the fourth doped region is a channel region of the second MOSFET.

3. The integrated circuit structure of claim 2 wherein the first and the second MOSFETs form a complimentary MOSFET pair of transistors.

4. The integrated circuit structure of claim 1 wherein the isolation region comprises a trench of electrically insulating material disposed between the first and the second doped regions and a layer of electrically insulating material overlying the first and the second doped regions.

5. The integrated circuit structure of claim 1 wherein the material of the isolation region comprises an electrically insulating material.

6. The integrated circuit structure of claim 1 wherein the material of the isolation region comprises silicon dioxide.

7. The integrated circuit structure of claim 1 wherein one of the plurality of layers is removed to expose a portion of the third doped region in the first trench and a portion of the fourth doped region in the second trench, and wherein the first oxide layer is proximate said exposed portion of the third doped region, and wherein the second oxide layer is proximate said exposed portion of the fourth doped region.

8. The integrated circuit structure of claim 1 further comprising:

a fifth doped region overlying the first doped region and of the same conductivity type as the first doped region, wherein the first doped region is a first source/drain region of a first MOSFET, and wherein said fifth doped region is a second source/drain region of said first MOSFET, and wherein the third doped region is a channel region of said first MOSFET;

a sixth doped region overlying the second doped region of the same conductivity type as the second doped region, wherein the second doped region is a first source/drain region of a second MOSFET, and wherein said sixth doped region is a second source/drain region of said second MOSFET, and wherein the fourth doped region is a channel region of said second MOSFET; and wherein the first oxide layer is a gate oxide layer of said first MOSFET; wherein the second oxide layer is a gate oxide layer of said second MOSFET.

9. The integrated circuit structure of claim 8 further comprising:

a first and a second conductive element adjacent the first and the second gate oxide layers, respectively, to control operation of the respective first and the second MOSFETs.

10. The integrated circuit structure of claim 9 wherein the first and the second conductive elements comprise polysilicon and operate as the gate for the first and the second MOSFETs, respectively.

11. The integrated circuit structure of claim 8 further comprising a third conductive element electrically connecting the first and the second source/drain regions.

12. The integrated circuit structure of claim 1 wherein at least one of the plurality of layers comprises a doped insulating layer for serving as a dopant source to diffuse dopants into the third and the fourth doped regions.

13. The integrated circuit structure of claim 12 wherein the third and the fourth doped regions each form a channel region, and wherein the dopants diffused from the doped insulating region form source/drain extensions within each of the channel regions.

14. An integrated circuit structure comprising:

a semiconductor layer having a major surface formed along a plane;

a first and a second doped source/drain region formed in the major surface;

an isolation region disposed overlying and between said first and said second source/drain regions for electrically insulating said first and said second source/drain regions;

a plurality of layers overlying said first and said isolation region, including a first and a second trench formed therein, wherein said first and said second trenches extend through said isolation region;

a first doped channel region formed in said first trench overlying said first source/drain region and having a different conductivity type than said first source/drain region;

a second doped channel region formed in said second trench overlying said second source/drain region and having a different conductivity type than said second source/drain region;

a third and a fourth doped spaced-apart source/drain region, wherein said third source/drain region is vertically aligned with said first channel region and said first source/drain region, and wherein said fourth source/drain region is vertically aligned with said second source/drain region and said second channel region, and wherein said third source/drain region is of the same conductivity type as the first source/drain region, and wherein said fourth source/drain region is of the some conductivity type as said second source/drain region;

a first oxide layer proximate said first channel region, and a second oxide layer proximate said second channel region.

* * * * *